(12) United States Patent
Li

(10) Patent No.: US 7,420,847 B2
(45) Date of Patent: *Sep. 2, 2008

(54) MULTI-STATE MEMORY HAVING DATA RECOVERY AFTER PROGRAM FAIL

(75) Inventor: Yan Li, Milpitas, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/304,960

(22) Filed: Dec. 14, 2005

(65) Prior Publication Data

US 2006/0126394 A1    Jun. 15, 2006

Related U.S. Application Data

(63) Continuation-in-part of application No. 11/097,517, filed on Apr. 1, 2005, now Pat. No. 7,158,421, and a continuation-in-part of application No. 11/013,125, filed on Dec. 14, 2004, now Pat. No. 7,120,051.

(51) Int. Cl.
*G11C 11/34* (2006.01)
(52) U.S. Cl. .............................. 365/185.22; 365/185.09
(58) Field of Classification Search ............ 365/185.22, 365/185.28, 185.09
See application file for complete search history.

(56) References Cited

U.S. PATENT DOCUMENTS

| 4,357,685 A | 11/1982 | Daniele et al. |
| 4,785,427 A | 11/1988 | Young |
| 5,034,922 A | 7/1991 | Burgess |
| 5,070,032 A | 12/1991 | Yuan et al. |
| 5,093,806 A | 3/1992 | Tran |

(Continued)

FOREIGN PATENT DOCUMENTS

EP    1134746 A2    9/2001

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Hoai V. Ho
*Assistant Examiner*—Anthan T Tran
(74) *Attorney, Agent, or Firm*—Davis Wright Tremaine LLP

(57) ABSTRACT

A non-volatile memory device includes the ability to recover data in event of a program failure without having to maintain a copy of the data until the write is completed. As the integrity of the data can thus be maintained with having to save a copy, buffers can be freed up for other data or even eliminated, reducing the amount of controller space that needs to devoted data buffering. In exemplary embodiments, the data is recovered by logically combining the verify data for the (failed) write process maintained in data latches with the results of one or more read operations to reconstitute the data. The exemplary embodiments are for memory cells storing multi-state data, both in the format of independent upper page, lower page form, as well as in 2-bit form. This can be accomplished by a state machine and data latches in the sense amp area on the memory, without use of the controller.

8 Claims, 24 Drawing Sheets

U.S. PATENT DOCUMENTS

| | | | |
|---|---|---|---|
| 5,095,344 A | 3/1992 | Harari |
| 5,172,338 A | 12/1992 | Mehrotra et al. |
| 5,245,571 A | 9/1993 | Takahashi |
| 5,274,646 A | 12/1993 | Brey et al. |
| 5,313,421 A | 5/1994 | Guterman et al. |
| 5,315,541 A | 5/1994 | Harari et al. |
| 5,343,063 A | 8/1994 | Yuan et al. |
| 5,418,752 A | 5/1995 | Harari et al. |
| 5,465,235 A | 11/1995 | Miyamoto |
| 5,519,847 A | 5/1996 | Fandrich et al. |
| 5,537,356 A | 7/1996 | Akaogi et al. |
| 5,570,315 A | 10/1996 | Tanaka et al. |
| 5,595,924 A | 1/1997 | Yuan et al. |
| 5,661,053 A | 8/1997 | Yuan |
| 5,734,816 A | 3/1998 | Niijima et al. |
| 5,768,192 A | 6/1998 | Eitan |
| 5,774,397 A | 6/1998 | Endoh et al. |
| 5,815,444 A | 9/1998 | Ohta |
| 5,822,245 A | 10/1998 | Gupta et al. |
| 5,860,082 A | 1/1999 | Smith et al. |
| 5,862,099 A | 1/1999 | Gannage et al. |
| 5,872,739 A | 2/1999 | Womack |
| 5,890,192 A | 3/1999 | Lee et al. |
| 5,903,495 A | 5/1999 | Takeuchi et al. |
| 5,920,502 A | 7/1999 | Noda et al. |
| 5,949,720 A | 9/1999 | Brady |
| 5,969,986 A | 10/1999 | Wong et al. |
| 6,011,287 A | 1/2000 | Itoh et al. |
| 6,011,725 A | 1/2000 | Eitan |
| 6,021,463 A | 2/2000 | Belser |
| 6,038,174 A | 3/2000 | Khan et al. |
| 6,040,997 A | 3/2000 | Estakhri |
| 6,046,935 A | 4/2000 | Takeuchi et al. |
| 6,046,940 A | 4/2000 | Takeuchi et al. |
| 6,097,638 A | 8/2000 | Himeno et al. |
| 6,222,762 B1 | 4/2001 | Guterman et al. |
| 6,266,273 B1 | 7/2001 | Conley et al. |
| 6,282,624 B1 | 8/2001 | Kimura et al. |
| 6,317,371 B2 | 11/2001 | Katayama et al. |
| 6,330,185 B1 | 12/2001 | Wong et al. |
| 6,373,746 B1 | 4/2002 | Takeuchi et al. |
| 6,374,337 B1 | 4/2002 | Estakhri |
| 6,388,920 B2 | 5/2002 | Katayama et al. |
| 6,407,953 B1 | 6/2002 | Cleeves |
| 6,421,279 B1 | 7/2002 | Tobita et al. |
| 6,426,893 B1 | 7/2002 | Conley et al. |
| 6,449,625 B1 | 9/2002 | Wang |
| 6,456,528 B1 | 9/2002 | Chen |
| 6,490,199 B2 | 12/2002 | Lee et al. |
| 6,490,649 B2 | 12/2002 | Sinclair |
| 6,504,757 B1 | 1/2003 | Hollmer et al. |
| 6,522,586 B2 | 2/2003 | Wong |
| 6,525,952 B2 | 2/2003 | Araki et al. |
| 6,560,143 B2 | 5/2003 | Conley et al. |
| 6,581,142 B1 | 6/2003 | Jacobs |
| 6,657,891 B1 | 12/2003 | Shibata et al. |
| 6,717,857 B2 | 4/2004 | Byeon et al. |
| 6,731,539 B1 | 5/2004 | Wong |
| 6,738,289 B2 | 5/2004 | Gongwer |
| 6,744,667 B2 | 6/2004 | Yamamoto et al. |
| 6,940,753 B2 | 9/2005 | Cernea |
| 6,983,428 B2 | 1/2006 | Cernea |
| 6,996,003 B2 | 2/2006 | Li et al. |
| 7,009,878 B2 | 3/2006 | Hosono et al. |
| 7,012,835 B2 | 3/2006 | Gonzalez et al. |
| 7,023,736 B2 | 4/2006 | Cernea et al. |
| 7,120,051 B2 | 10/2006 | Gorobets et al. |
| 7,158,421 B2 | 1/2007 | Li et al. |
| 2001/0006477 A1 | 7/2001 | Banks |
| 2001/0006479 A1 | 7/2001 | Ikehashi et al. |
| 2001/0040826 A1* | 11/2001 | Lakhani .................. 365/185.22 |
| 2002/0036925 A1 | 3/2002 | Tanzawa et al. |
| 2002/0039322 A1 | 4/2002 | Tran et al. |
| 2002/0118574 A1 | 8/2002 | Gongwer et al. |
| 2002/0126528 A1 | 9/2002 | Conley e al. |
| 2002/0126532 A1 | 9/2002 | Matsunaga et al. |
| 2003/0065899 A1 | 4/2003 | Gorobets |
| 2003/0070036 A1 | 4/2003 | Gorobets |
| 2003/0072192 A1 | 4/2003 | Bloom et al. |
| 2003/0099143 A1 | 5/2003 | Lasser et al. |
| 2003/0117850 A1 | 6/2003 | Yano |
| 2003/0123295 A1* | 7/2003 | Elmhurst et al. ........ 365/185.22 |
| 2003/0137888 A1 | 7/2003 | Chen et al. |
| 2003/0163629 A1 | 8/2003 | Conley et al. |
| 2003/0174555 A1* | 9/2003 | Conley et al. ................ 365/200 |
| 2004/0057285 A1 | 3/2004 | Cernea et al. |
| 2004/0057287 A1 | 3/2004 | Cernea et al. |
| 2004/0057318 A1 | 3/2004 | Cernea et al. |
| 2004/0060031 A1 | 3/2004 | Cernea |
| 2004/0109357 A1 | 6/2004 | Cernea et al. |
| 2004/0109362 A1 | 6/2004 | Gongwer et al. |
| 2004/0160829 A1 | 8/2004 | Tsujikawa et al. |
| 2004/0210729 A1 | 10/2004 | Horri et al. |
| 2004/0237000 A1* | 11/2004 | Keays ......................... 714/42 |
| 2004/0240269 A1 | 12/2004 | Cernea |
| 2005/0047217 A1* | 3/2005 | Shibata et al. .......... 365/189.01 |
| 2005/0157560 A1 | 7/2005 | Hosono et al. |
| 2005/0169057 A1* | 8/2005 | Shibata et al. .......... 365/185.28 |
| 2005/0169082 A1 | 8/2005 | Cernea |
| 2005/0257120 A1 | 11/2005 | Gorobets et al. |
| 2006/0031593 A1 | 2/2006 | Sinclair |
| 2006/0126390 A1 | 6/2006 | Gorobets et al. |
| 2006/0126393 A1 | 6/2006 | Li |
| 2006/0136687 A1 | 6/2006 | Smith et al. |
| 2006/0140007 A1 | 6/2006 | Cernea et al. |
| 2006/0221697 A1 | 10/2006 | Li et al. |
| 2006/0221704 A1 | 10/2006 | Li et al. |

FOREIGN PATENT DOCUMENTS

| | | |
|---|---|---|
| EP | 1164595 A | 12/2001 |
| EP | 1280161 A1 | 1/2003 |
| JP | 5282883 | 10/1993 |
| JP | 11003290 | 11/1999 |
| WO | WO 00/49488 | 8/2000 |
| WO | WO 00/67137 | 11/2000 |
| WO | WO 02/49039 | 6/2002 |
| WO | WO 02/058074 | 7/2002 |
| WO | WO 02/069340 | 9/2002 |
| WO | WO 03/029951 | 4/2003 |
| WO | WO 03/069627 | 8/2003 |
| WO | WO 2006/107654 | 10/2006 |

OTHER PUBLICATIONS

Imamiya et al., "A 125-mm² 1-Gb NAND Flash Memory with 10/Mbyte/s Program Speed," *IEEE Journal of Solid State Circuits*, vol. 37, No. 11, Nov. 2002, pp. 1493-1501.

Lee et al., "High-Performance 1-Gb NAND Flash Memory with 0.12-μm Technology," *Journal of Solid-State Circuits*, Nov. 2002, vol. 37, No. 11, pp. 1502-1509.

Nakamura et al., "A Novel Sense Amplifier for Flexible Voltage Operation NAND Flash Memories," 1995 *Symposium on VLSI Circuits Digest of Technical Papers*, Jun. 8-10, 1995, pp. 71-72.

Srisa-an et al., "Performance Enhancements to the Active Memory System," *2002 IEEE International Conference on Computer Design: VLSI in Computers and Processors*, Sep. 16-18, 2002, pp. 249-256.

Notification of Transmittal of the International Search Report and the Written Opinion of the International Searching Authority, or the Declaration for International Application No. PCT/US2005/016341 mailed Oct. 19, 2005, 12 pages.

Notification of Transmittal of the International Search Report and the Written Opinion of the International Searching Authority, or the Declaration for International Application No. PCT/US2005/043020 mailed May 10, 2006, 9 pages.

EPO/ISA, "Notification of Transmittal of the International Search Report and the Written Opinion of the International Searching Authority, or the Declaration," mailed in the International Application No. PCT/US2006/011032 on Jul. 20, 2006, 9 pages.

Notification of Transmittal of the International Search Report and the Written Opinion of the International Searching Authority, or the Declaration for International Application No. PCT.US2006/011248 for SanDisk Corporation, mailed Jul. 24, 2006, 11 pages.

Notification of Transmittal of the International Search Report and the Written Opinion of the International Searching Authority, or the Declaration for International Application No. PCT/US2006/0112323 for SanDisk Corporation, Aug. 9, 2006, 10 pages.

Notice of Allowance for U.S. Appl. No. 11/304,783 mailed Nov. 5, 2007, 7 pages.

List of Allowed Claims for U.S. Appl. No. 11/304,783, 4 pages.

\* cited by examiner

Input Logic Truth Table

| Transfer Mode | ONE | ONEB<0> | ONEB<1> | PBus (Input) | BSI (Output) |
|---|---|---|---|---|---|
| Pass-Through | 1 | 0 | 0 | PBus | PBus |
| Invert | 0 | 1 | 1 | PBus | PBus* |
| Float | 1 | 1 | 0 | PBus | Float |

Output Logic Truth Table

| Transfer Mode | PINV | NINV | PDIR | NDIR | MTCH | PBus (Output) |
|---|---|---|---|---|---|---|
| Pass-Through | D | D | D | 1 | 0 | 0 |
|  | 0 | D | D | D | 1 | 1 |
| Invert | D | D | 0 | D | 0 | 1 |
|  | D | 1 | D | D | 1 | 0 |
| Float | D | D | D | D | X | Z |
| Pre-Charge | 0 | D | 0 | D | X | 1 |

(Default Values: PINV=1, NINV=0, PDIR=1, NDIR=0)

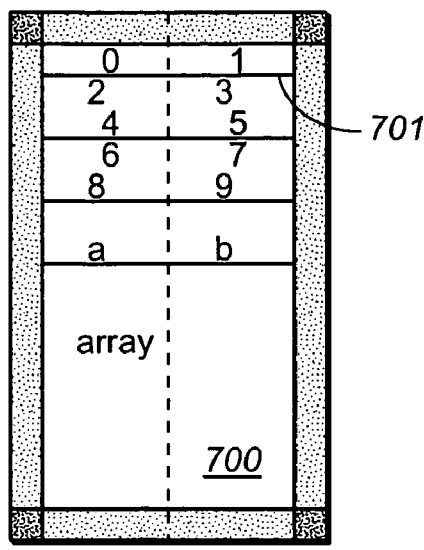 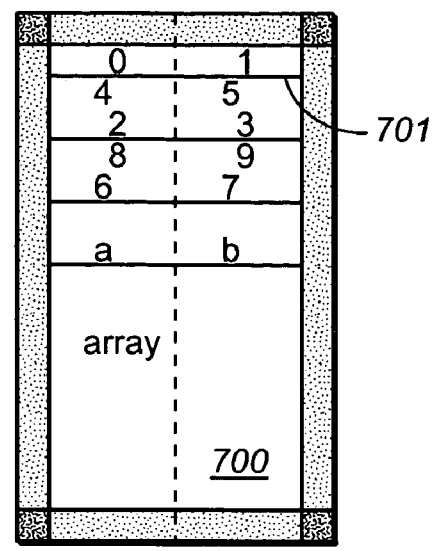
FIG. 26A            FIG. 26B
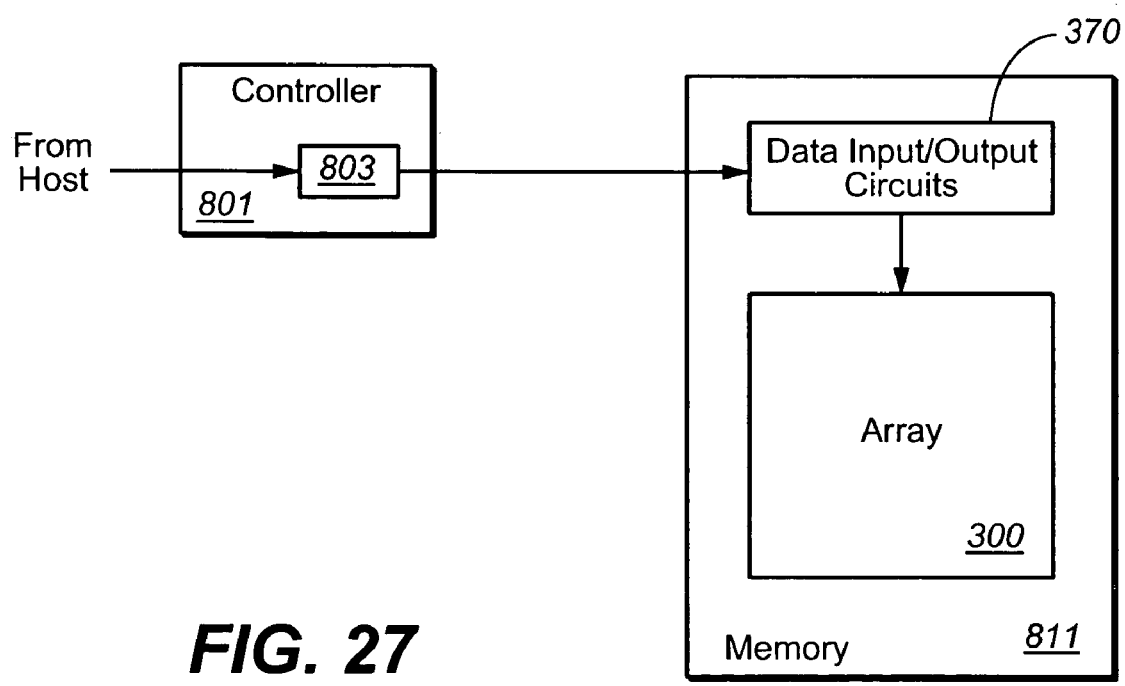
FIG. 27

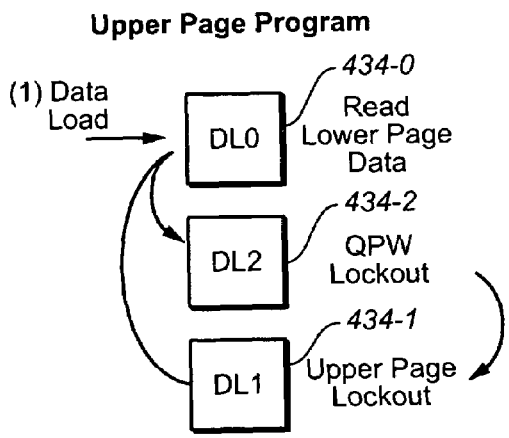
FIG. 28
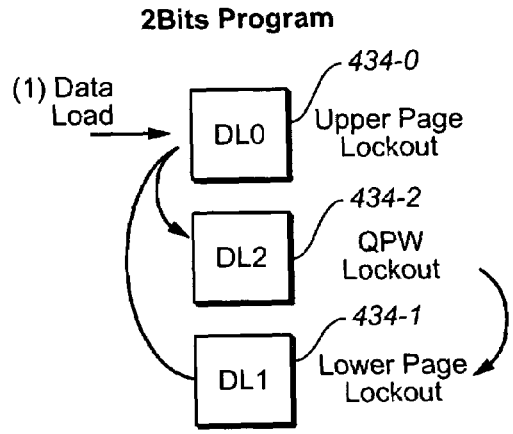
FIG. 32
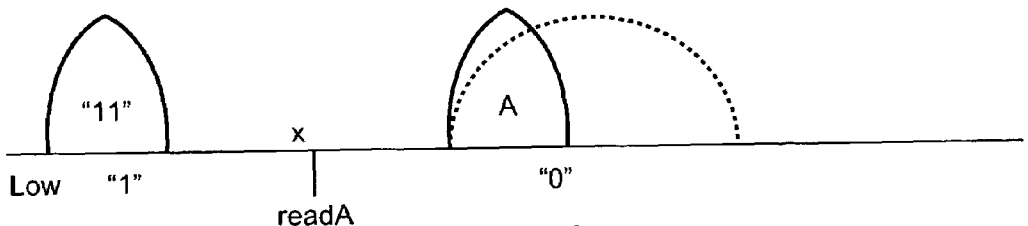
FIG. 29
| Cell Target Data | "1" | "0" |
|---|---|---|
| (1) DL1 Data Remain After Program | 1 | 0 (Fail to Verify) |
| (2) readA (~SA) | 1 | 1 (Error) |
| (3) Recovered Data (1) + (2) | 1 | 0 (Non-Overwrite) |
FIG. 30
| Cell Target Data | "11" | "10" | "00" | "01" |
|---|---|---|---|---|
| ---Lower Page Data (DL0) | 1 | 0 | 0 | 1 |
| -- | | | | |
| (1C) Data Remain in DL1 (C Error <Bstate) | 1 | 1 | 1 | 0 |
| (2C) readB (~SA) | 1 | 1 | 0 | 1 |
| (3C) Data Recovery 0 Overwrite 1 (DL1) | 1 | 1 | 0 | 0 |
| -- Under-Program on B | | | | |
| (1B) Data Remain in DL1 (B Error) | 1 | 1 | 0 | 1 |
| (2B) readB (~SA) | 1 | 1 | 0 | 0 |
| (3B) Data Recovery 0 Overwrite 1 (DL1) | 1 | 1 | 0 | 0 |
FIG. 31

FIG. 33

| Cell Target Data | "11" | "10" | "00" | "01" |
|---|---|---|---|---|
| ---Upper Page Data (DL0) | 1 | 1 | 1 | 1 |
| ---Lower Page Data Remain in DL1 (A Error) | 1 | [0] | 1 | 1 |
| (1) readA | 1 | [1] | 0 | 0 |
| (2) Combine (1) +DL1→DL1 (readA & DL1→DL1) | 1 | 0 | 0 | 0 |
| (4) readB +DL0→DL0 (readB & DL0→DL0) | 1 | 1 | 0 | 0 |
| (5) readC (Reversed) | 0 | 0 | 0 | 1 |
| (6) Combine (5) +DL1→DL1 (~readC |DL1→DL1) | 1 | 0 | 0 | 1 |
| | | | | |
| ---Upper Page Data (DL0) | 1 | 1 | [0] | 1 |
| ---Lower Page Data Remain in DL1 (B Error) | 1 | 1 | [0] | 1 |
| (1) readA | 1 | 0 | [1/0] | 0 |
| (2) Combine (1) +DL1→DL1 (readA & DL1→DL1) | 1 | 0 | 0 | 0 |
| (3) readB | 1 | 1 | [1] | 0 |
| (4) readB +DL0→DL0 (readB & DL0→DL0) | 1 | 1 | 0 | 0 |
| (5) readC (Reversed) | 0 | 0 | 0 | 1 |
| (6) Combine (5) +DL1→DL1 (~readC | DL1→DL1) | 1 | 0 | 0 | 1 |
| | | | | |
| ---Upper Page Data (DL0) | 1 | 1 | 1 | [0] |
| ---Lower Page Data Remain in DL1 (C Error) | 1 | 1 | 1 | 1 |
| (1) readA (Assume C Pass readA, Fail C) | 1 | 0 | 0 | 0 |
| (2) Combine (1)+DL1→DL1 (readA & DL1→DL1) | 1 | 0 | 0 | 0 |
| (3) readB | 1 | 1 | 0 | [1/0] |
| (4) readB + DL0→DL0 (readB & DL0→DL0) | 1 | 1 | 0 | 0 |
| (5) readC (Reversed) | 0 | 0 | 0 | 0 |
| (5')Correct readC Result by Checking "01" C Data (~DL0 & DL1) | 0 | 0 | 0 | 1 |
| (6)Combine (5 (5')) +DL1→DL1 (~readC |DL1| (~DL0 & DL1)→DL1) | 1 | 0 | 0 | 1 |
| | | | | |
| ---Upper Page Data (DL0) | 1 | 1 | 1 | [0] |
| ---Lower Page Data Remain in DL1 (C Error) | 1 | 1 | 1 | 1 |
| (1) readA (Assume Fail A) | 1 | 0 | 0 | [1] |
| (2) Combine (1) +DL1→DL1 (readA & DL1→DL1) | 1 | 0 | 0 | [1] |
| (3) readB | 1 | 1 | 0 | [1] |
| (4) readB +DL0→DL0 (readB & DL0→DL0) | 1 | 1 | 0 | 0 |
| (5) readC (Reversed) | 0 | 0 | 0 | [0] |
| (5') Correct readC Result by Checking "01" C Data (~DL0 & DL1) | 0 | 0 | 0 | 1 |
| (6)Combine (5 (5')) +DL1→DL1 (~readC |DL1| (~DL0 & DL1)→DL1) | 1 | 0 | 0 | 1 |

| Cell Target Data | "11" | "01" | "10" | "00" |
|---|---|---|---|---|
| ---Upper Page Data (DL1) | 1 | 1 | 1 | 1 |
| ---Lower Page Data Remain in DL0 (A Error) | 1 | [0] | 1 | 1 |
| (1) readA | 1 | [1] | 0 | 0 |
| (2) Combine (1) +DL0→DL0 (readA & DL0→DL0) | 1 | 0 | 0 | 0 |
| (3) readB | 1 | 1 | 0 | 0 |
| (4) Combine DL0 with DL0→DL0 ((readA & DL0) \| ~readB) | 1 | 0 | 1 | 1 |
| (5) readC | 1 | 1 | 1 | 0 |
| (6) Combine (5) +DL1→DL1 ((readA & DL0) \|~readB) & readC | 1 | 0 | 1 | 0 |
|  |  |  |  |  |
| ---Lower Page Data (DL0) (B Error) | 1 | 1 | [0] | 1 |
| ---Upper Page Data Remain in DL1 | 1 | 1 | 1 | 1 |
| (0) ~DL0 & DL1 | 0 | 0 | 1 | 0 |
| (1) readA | 1 | 1 | [1/0] | 0 |
| (2) Combine (1) +DL0→DL0 (readA & DL0→DL0) | 1 | 0 | 0 | 0 |
| (3) ~readB | 0 | 0 | [0/1] | 1 |
| (4) ((readA & DL0) \| ~readB \| (~DL0 & DL1)) | 1 | 0 | 1 | 1 |
| (5) readC | 1 | 1 | 1 | 0 |
| (6) Combine (5) +DL0→DL0 ((4) & readC) | 1 | 0 | 1 | 0 |
|  |  |  |  |  |
| ---Lower Page Data (DL0) (C Error) | 1 | 1 | 1 | [0] |
| ---Upper Page Data Remain in DL1 | 1 | 1 | 1 | [0] |
| (0) DL0 \| DL1 | 1 | 1 | 1 | 0 |
| (1) readA (Assume C Pass readA, Fail C) (readA & DL0→DL0) | 1 | 0 | 0 | 0 |
| (2) ~readB | 0 | 0 | 1 | [0/1] |
| (3) Combine (1) and (2) (DL0 \| ~readB)→DL0 | 1 | 0 | 1 | [0/1] |
| (4) readC | 1 | 1 | 1 | 1 |
| (5) Combine (4) with DL0 (DL0 & readC→DL0) | 1 | 0 | 1 | [0/1] |
| (6) Combine (0) with DL0 (DL0 & (DL0 \|DL1)→DL0) | 1 | 0 | 1 | 0 |

*FIG. 34*

LM Upper Page Program

LM Upper Page Program

MULTI-STATE MEMORY HAVING DATA RECOVERY AFTER PROGRAM FAIL

CROSS REFERENCE TO RELATED APPLICATIONS

The present application is related to U.S. application Ser. No. 11/304,783, of Yan Li, entitled "Data Recovery Methods in Multi-State Memory After Program Fail," which is filed concurrently with the present application. This application is also a Continuation in Part of both U.S. patent application Ser. No. 11/097,517, filed Apr. 1, 2005, and U.S. patent application Ser. No. 11/013,125, filed Dec. 14, 2004. It is also related to U.S. patent applications Ser. No. 11/097,590, filed Apr. 1, 2005. These applications are all incorporated herein by reference in their entirety for all purposes.

FIELD OF THE INVENTION

This invention relates generally to non-volatile semiconductor memory such as electrically erasable programmable read-only memory (EEPROM) and flash EEPROM, and specifically to methods of implementing quick pass write or other multi-phase programming techniques.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage-level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection" a high voltage applied to the drain accelerates electrons across the substrate channel region. At the same time a high voltage applied to the control gate pulls the hot electrons through a thin gate dielectric onto the floating gate. In "tunneling injection" a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

EXAMPLES OF NON-VOLATILE MEMORY CELLS

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1-left and T1-right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIGS. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a *"Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 μA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

U.S. Patent Publication No. US-2004-0060031-A1 discloses a high performance yet compact non-volatile memory device having a large block of read/write circuits to read and write a corresponding block of memory cells in parallel. In particular, the memory device has an architecture that reduces redundancy in the block of read/write circuits to a minimum. Significant saving in space as well as power is accomplished by redistributing the block of read/write modules into a block read/write module core portions that operate in parallel while interacting with a substantially smaller sets of common portions in a time-multiplexing manner. In particular, data processing among read/write circuits between a plurality of sense amplifiers and data latches is performed by a shared processor.

When a programming operation fails, in the sense that one or more cells fail to verify as correctly programmed at the target state, the data to be written is lost unless it is retained in a set of buffers until the program operation is complete. This is particularly the case when two or more bits are programmed in one physical cell, particularly when these bits are arranged into independent pages, such as an upper page/lower page arrangement. When the upper page program fails, the lower page data is also ruined. As the lower page may have been programmed quite some time ago, it is likely not maintained in a buffer and will have been lost. Also, the need to retain target data in buffers until a program operation is complete results in less ability to pipeline operations, greater buffer requirements, or both.

Therefore there is a general need for high performance and high capacity non-volatile memory. In particular, there is a need for a compact non-volatile memory with program performance having an improved ability to recovery data in event of a program failure.

SUMMARY OF INVENTION

According to one aspect of the invention, provides a method and corresponding circuitry for governing a multi-phase programming process in a non-volatile memory. More specifically, the exemplary embodiment uses a quick pass write technique where a single programming pass is used, but the biasing of the selected memory cells is altered to slow programming as the memory cells approach their target values. After each programming pulse, the memory is verified at a first, lower verify value, followed by a second verify at a second higher level. The second level is used to lock out a selected cell from further programming. The first, lower verify level is used to change the programming phase. In the exemplary embodiment, raising the voltage level of the channels of the selected memory cells does this. A principle aspect of the present invention introduces a latch associated with the read/write circuitry connectable to each selected memory cell along a corresponding bit line for the storage of the result of the verify at this lower level. In an N state memory, each memory cell selected for programming will have associated with it N+1 latches, N latches to keep track of the target data and an (N+1)st latch for governing the programming phase.

The exemplary embodiment is a memory of the NAND-type, specifically in an all bit line architecture. A programming waveform of a rising staircase form is applied along a selected word line. In the initial programming phase, the selected memory cells have their channels set to ground, by setting their corresponding bit lines to ground, in order to facilitate programming. Once there is a successful verify at the lower verify level, the bit line voltage is raised, in the exemplary embodiment through the level on a set of bit line clamps, so that the channels of the selected memory cells are allowed to come up to a higher voltage level, thereby slowing programming. The exemplary embodiment utilizes a bit line clamp to adjust the bias level on the bit lines. The read/write stack associated with each bit line has a set of data latches usable to govern the write process, with one of these latches used to store the result of the verify at the lower level and thereby govern the programming phase, as well as sufficient latches to monitor the standard programming process.

According to other aspects of the invention, in event of a program failure the memory is able to recover the data without having to maintain a copy of the data until the write is completed. As the integrity of the data can thus be maintained with having to save a copy, buffers can be freed up for other data or even eliminated, reducing the amount of controller space that needs to devoted data buffering. In exemplary embodiments, the data is recovered by logically combining the verify data for the (failed) write process maintained in data latches with the results of one or more read operations to reconstitute the data.

The exemplary embodiments are for memory cells storing multi-state data, both in the format of independent upper page, lower page form, as well as in 2-bit form. Both the upper and lower pages of data can be recovered and then written to a new location in the memory, either as independent pages or as part of a full sequence write. This can be accomplished by a state machine and data latches in the sense amp area on the memory, without use of the controller. Examples of the process are given for various encoding of data into upper and lower pages.

Additional features and advantages of the present invention will be understood from the following description of its preferred embodiments, which description should be taken in conjunction with the accompanying drawings.

BRIEF DESCRIPTION OF THE DRAWINGS

FIGS. 26A and 26B show different methods of assigning upper and lower pages to word lines.

FIG. 27 is a schematic illustration of the transfer of data from a host to a memory in a write process.

FIG. 28 shows a data latch assignment for upper page/lower page programming.

FIG. 29 illustrates a failed lower page write process.

FIG. 30 is a table showing a lower page data recovery operation.

FIG. 31 is a table showing an upper page data recovery operation when "conventional code" is used.

FIG. 32 shows a data latch assignment for full sequence, 2-bit programming.

FIG. 33 is a table showing a recovery operation when full sequence, 2-bit programming is used.

FIG. 34 is a table showing a data recovery operation when "LM new code" is used.

DETAILED DESCRIPTION OF THE PREFERRED EMBODIMENTS

Figure 1A:
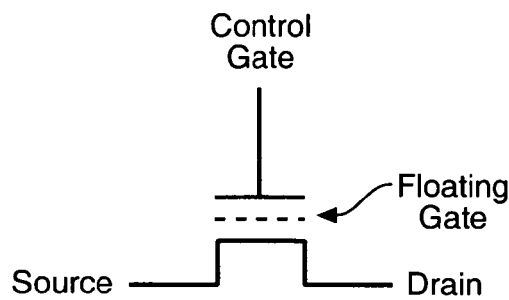
FIGS. 1A-1E illustrate schematically different examples of non-volatile memory cells.
Figure 1B:
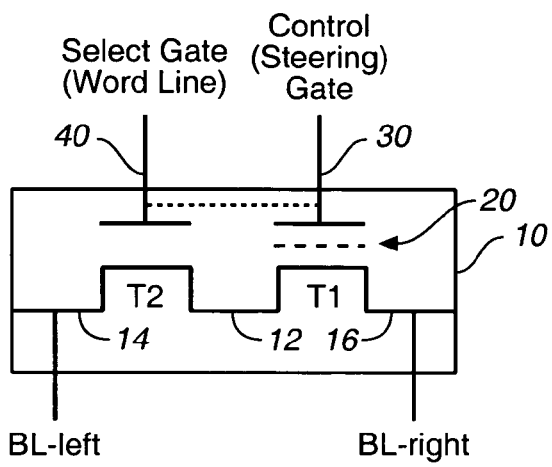
Figure 1C:
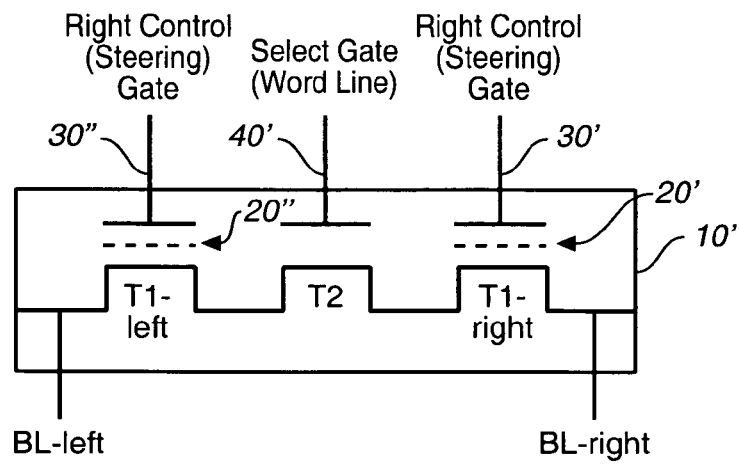
Figure 1D:
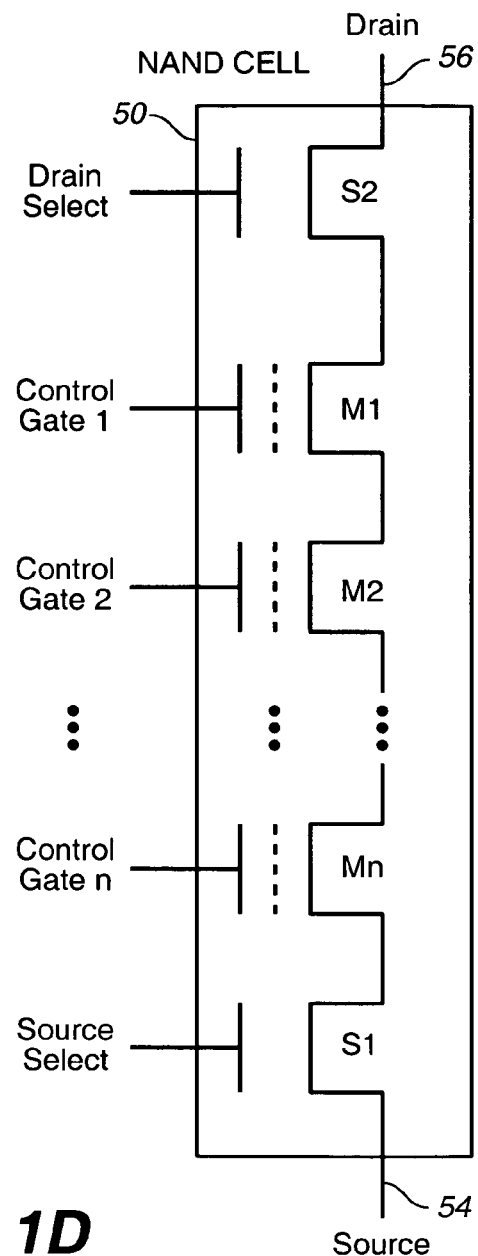
Figure 1E:
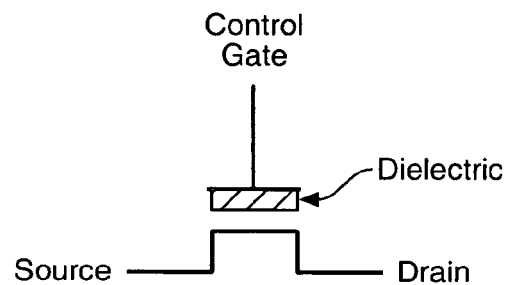
Figure 2:
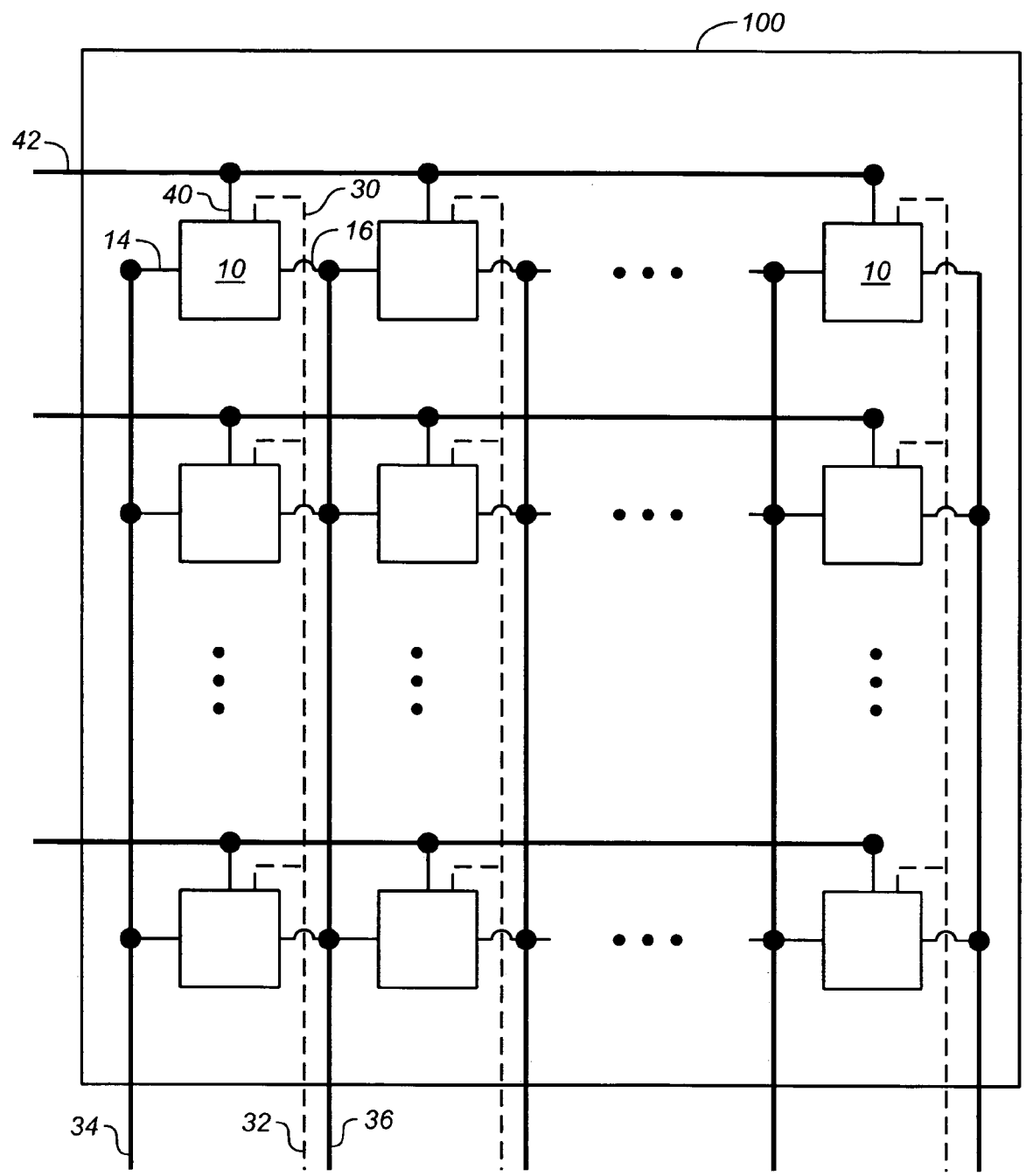
FIG. 2 illustrates an example of an NOR array of memory cells.
Figure 3:
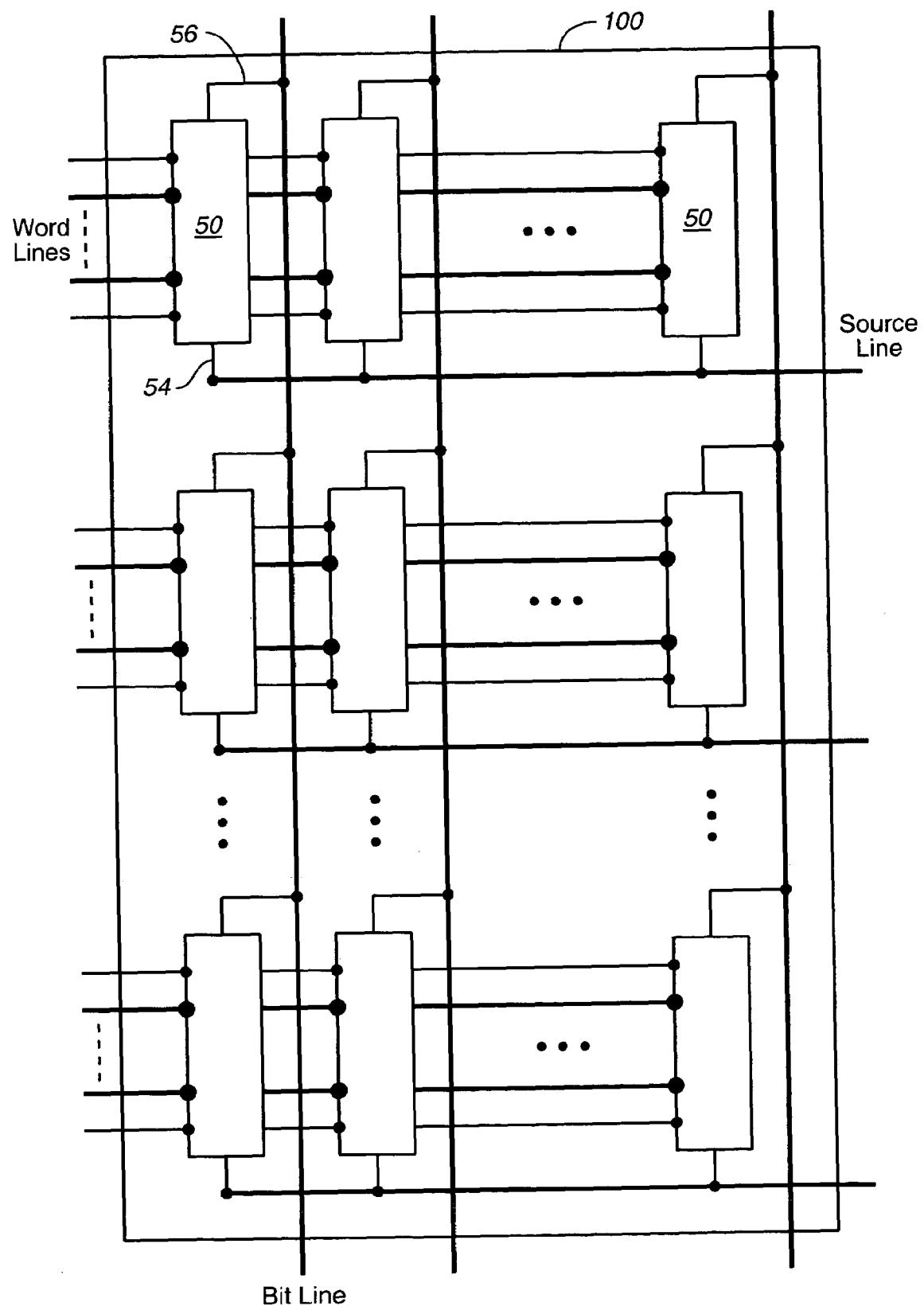
FIG. 3 illustrates an example of an NAND array of memory cells, such as that shown in FIG. 1D.
Figure 4:
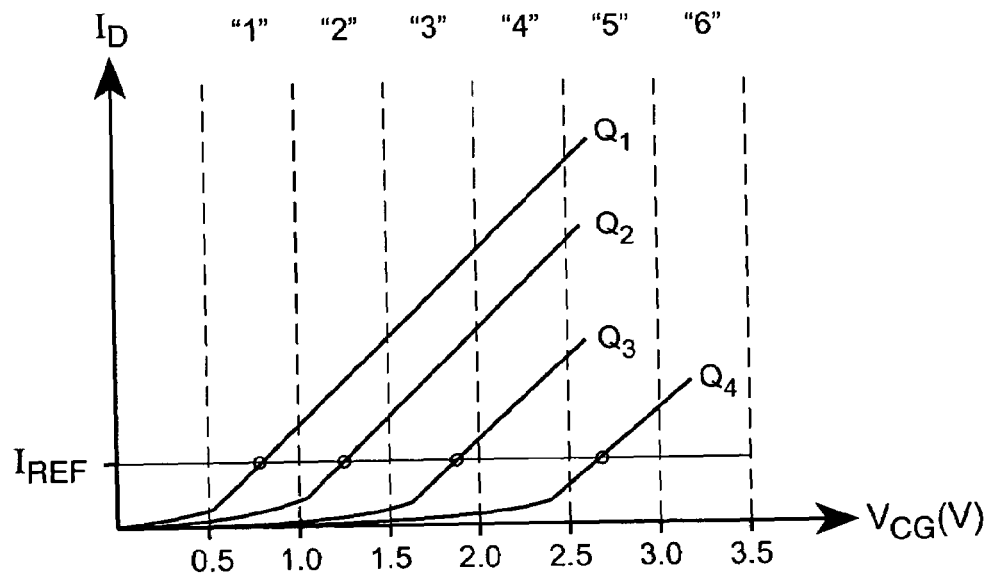
FIG. 4 illustrates the relation between the source-drain current and the control gate voltage for four different charges Q1-Q4 that the floating gate may be storing at any one time.
Figure 5:
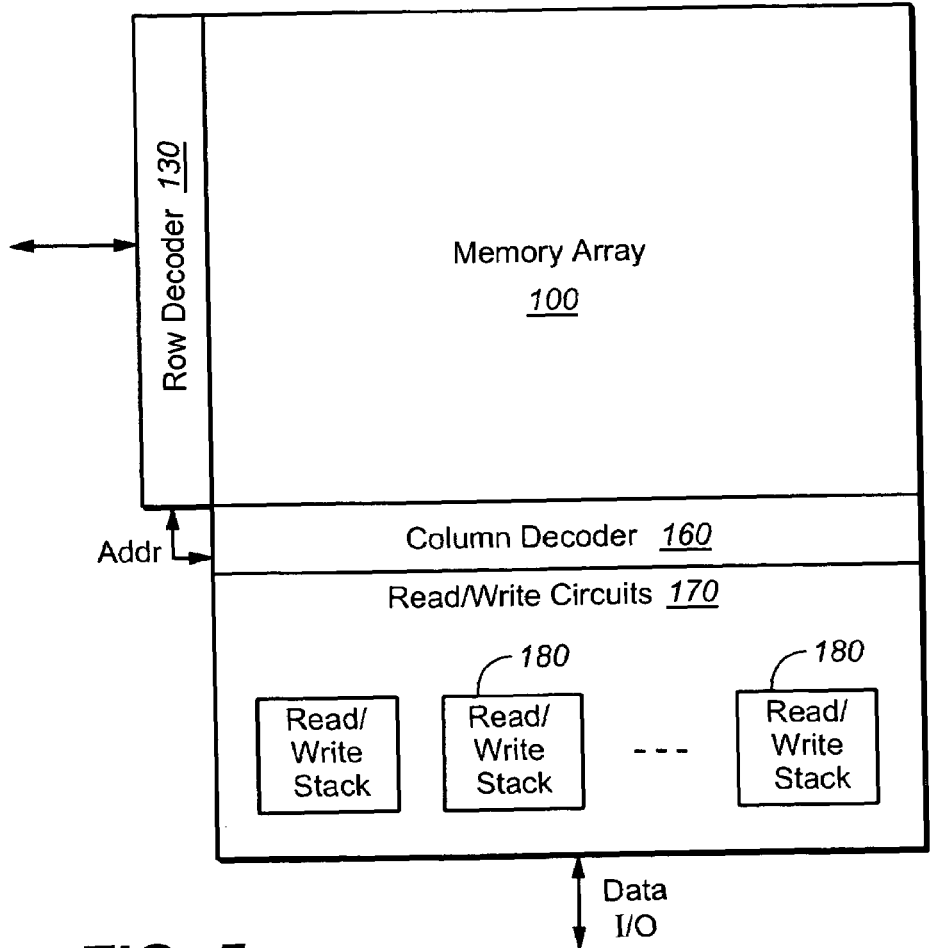
FIG. 5 illustrates schematically a typical arrangement of a memory array accessible by read/write circuits via row and column decoders.
Figure 6A:
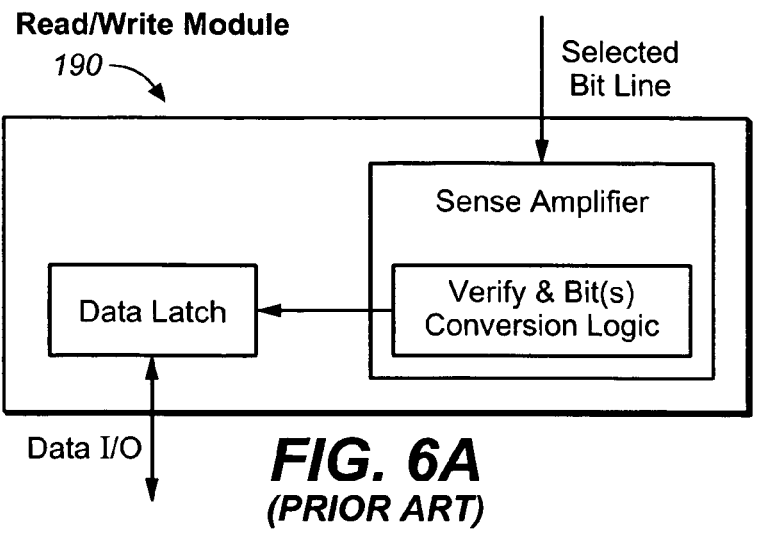
FIG. 6A is a schematic block diagram of an individual read/write module.
Figure 6B:
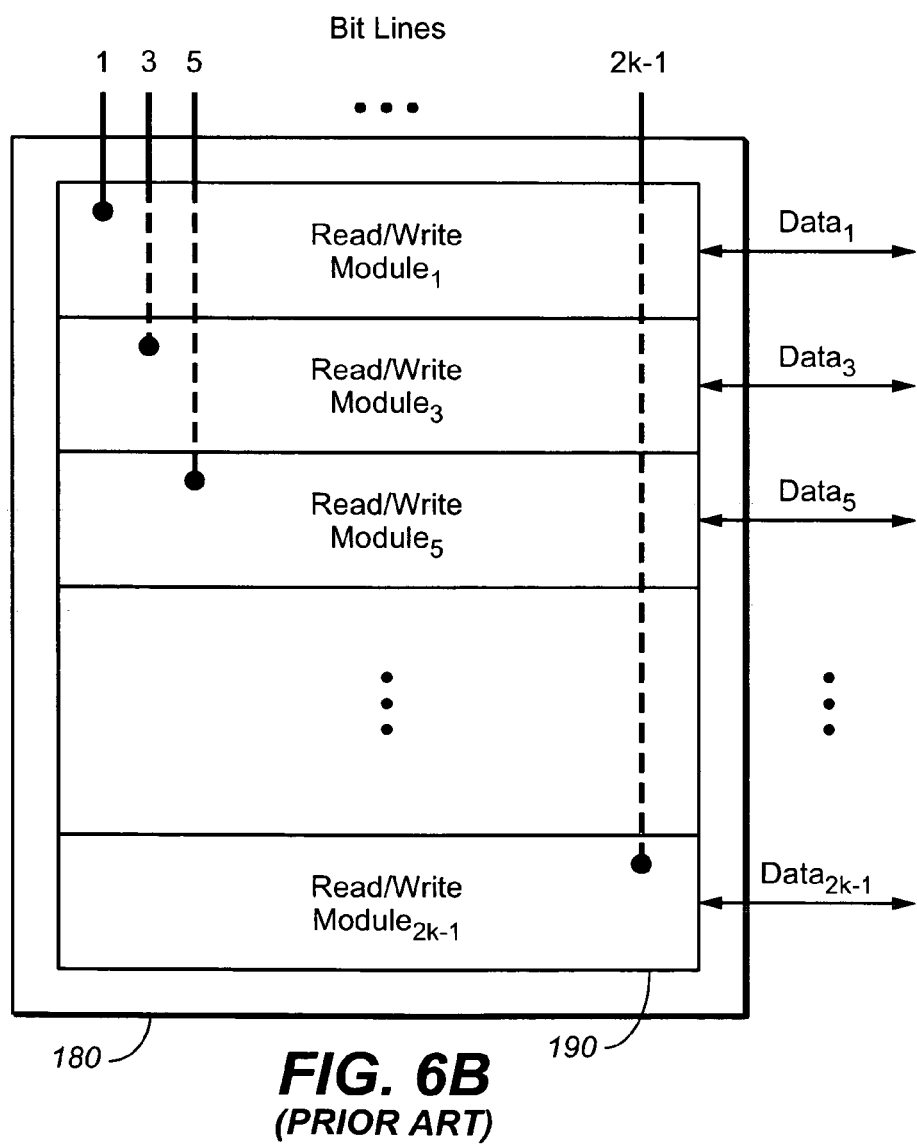
FIG. 6B shows the read/write stack of FIG. 5 implemented conventionally by a stack of read/write modules.
Figure 7A:
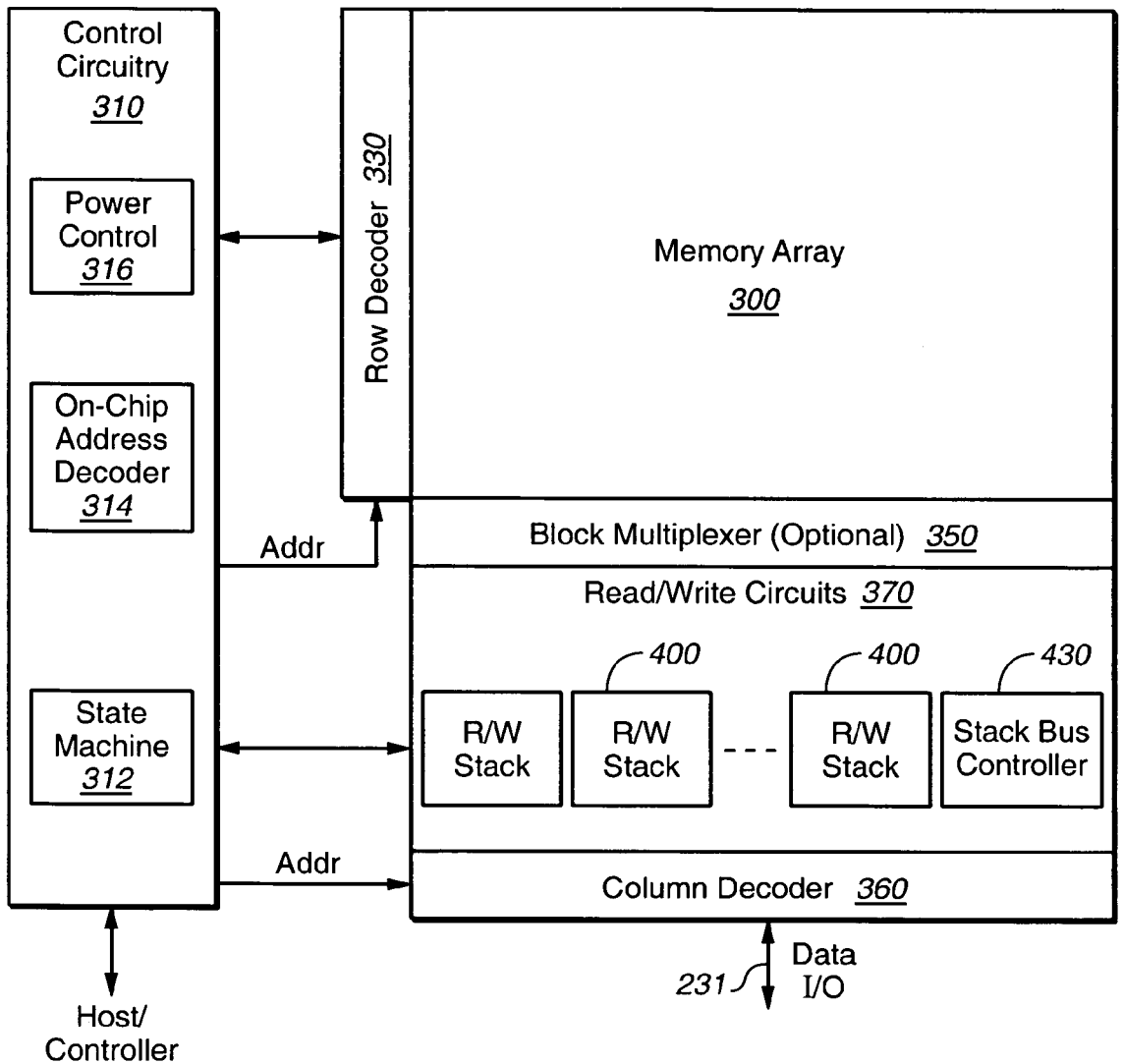
FIG. 7A illustrates schematically a compact memory device having a bank of partitioned read/write stacks, in which the improved processor of the present invention is implemented.

FIG. 7A illustrates schematically a compact memory device having a bank of partitioned read/write stacks, in which the improved processor of the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 7B:
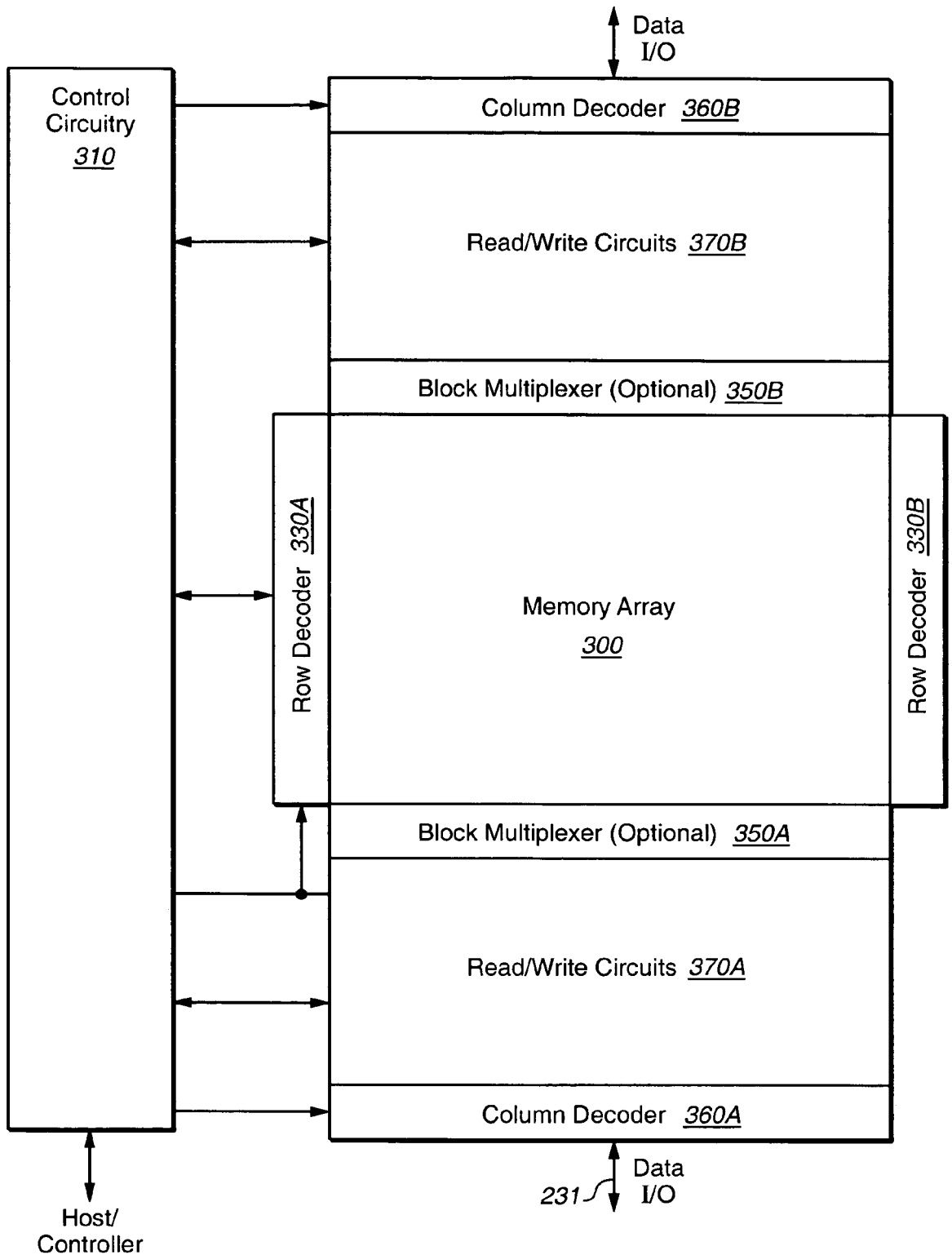
FIG. 7B illustrates a preferred arrangement of the compact memory device shown in FIG. 7A.

FIG. 7B illustrates a preferred arrangement of the compact memory device shown in FIG. 7A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 8:
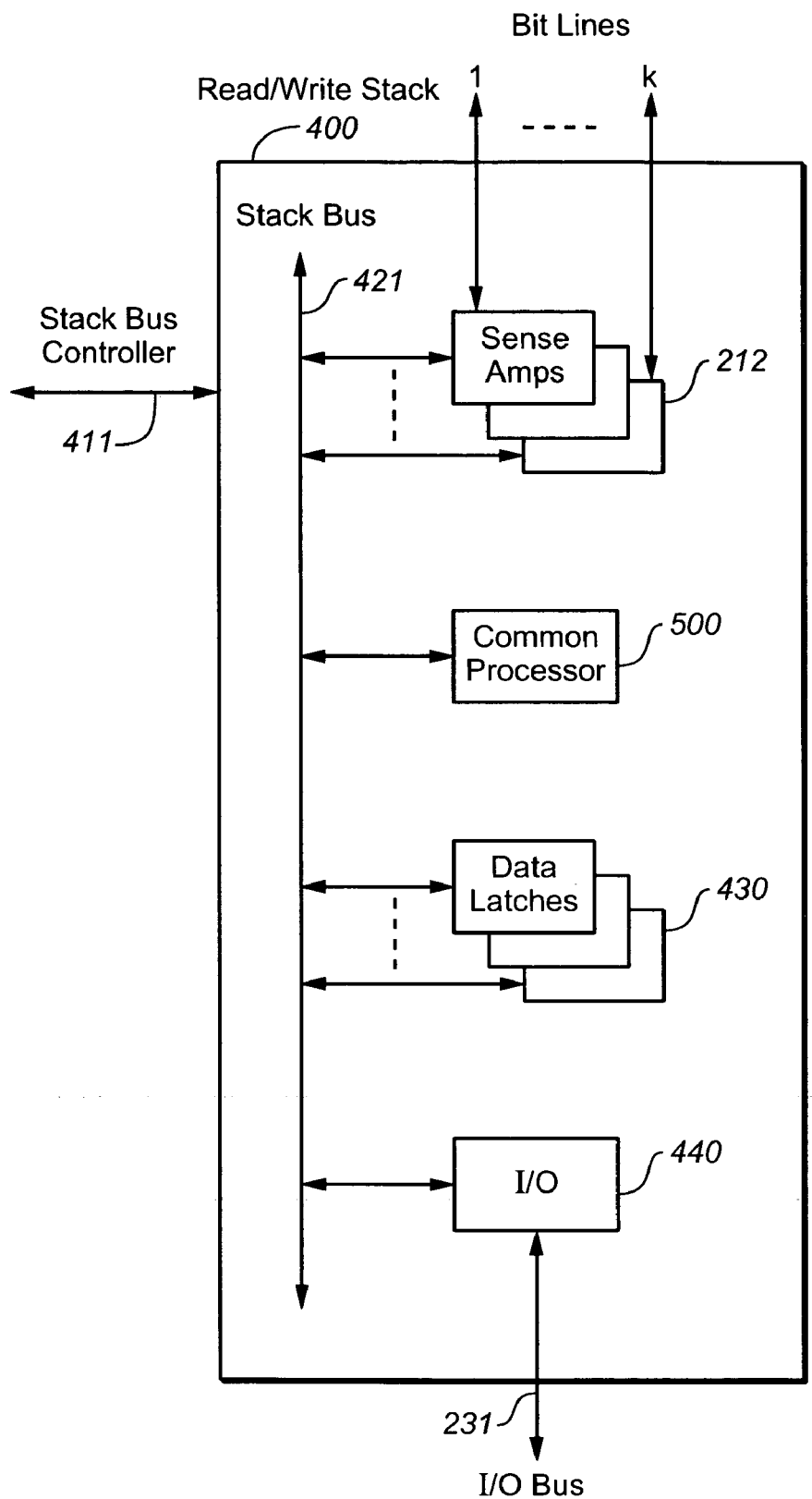
FIG. 8 illustrates schematically a general arrangement of the basic components in a read/write stack shown in FIG. 7A.

FIG. 8 illustrates schematically a general arrangement of the basic components in a read/write stack shown in FIG. 7A. According to a general architecture of the invention, the read/write stack 400 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks.

Figure 9:
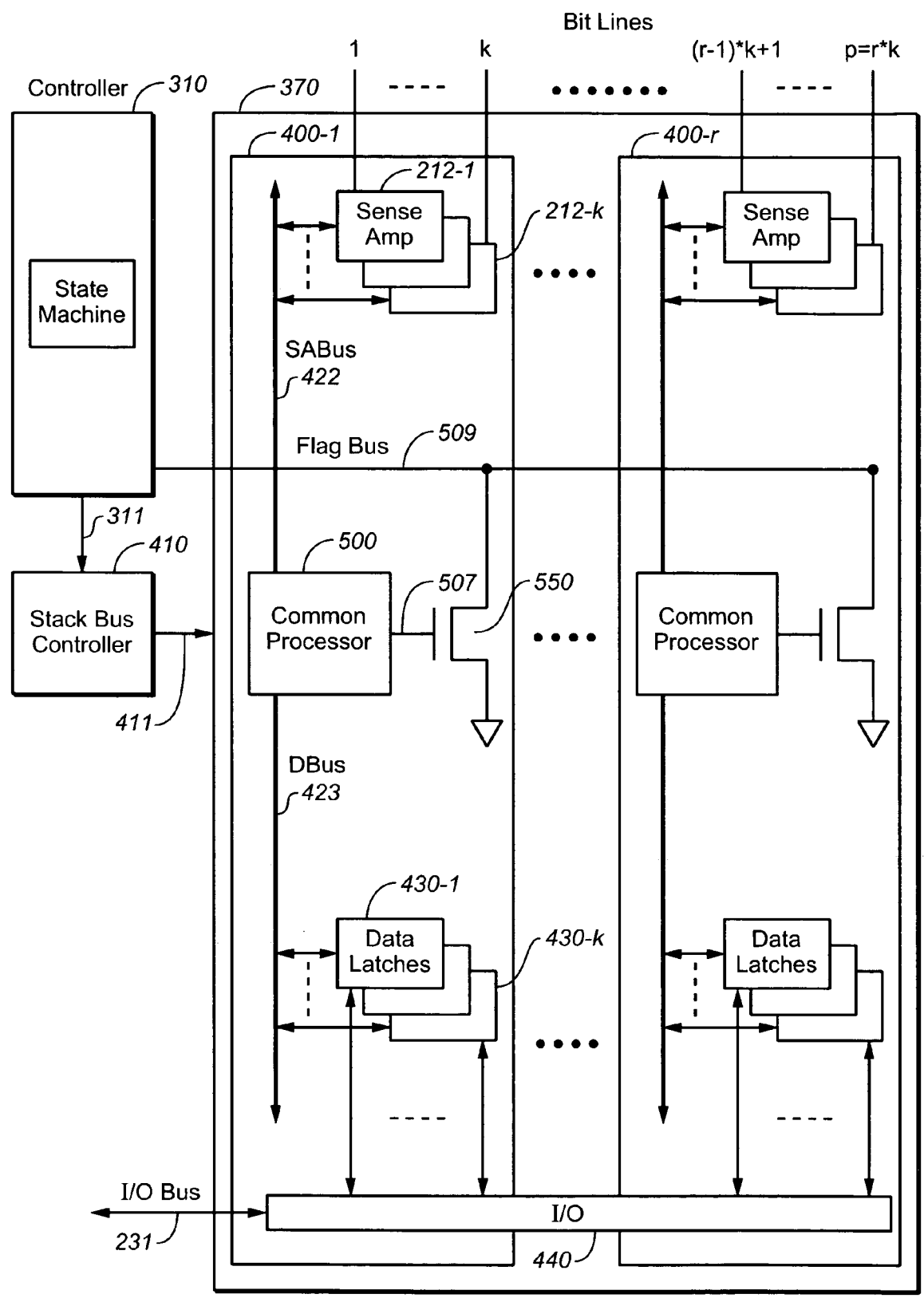
FIG. 9 illustrates one preferred arrangement of the read/write stacks among the read/write circuits shown in FIGS. 7A and 7B.

FIG. 9 illustrates one preferred arrangement of the read/write stacks among the read/write circuits shown in FIGS. 7A and 7B. Each read/write stack 400 operates on a group of k bit lines in parallel. If a page has p=r*k bit lines, there will be r read/write stacks, 400-1, . . . , 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-k servicing a segment of k memory cells in parallel. A preferred sense amplifier is disclosed in U.S. Patent Publication No. 2004-0109357-A1, the entire disclosure of which is hereby incorporated herein by reference. It should be noted that this is just one particular embodiment, with k as the number of bits in a byte and r is the number of bytes that are grouped together. In the present invention, the particular data latch structure is not basic to the various aspect of the invention, as long as a sufficient number of data latches, specifically one for each bit storable on a cell, is connectable to a bit line.

The stack bus controller 410 provides control and timing signals to the read/write circuit 370 via lines 411. The stack bus controller is itself dependent on the memory controller 310 via lines 311. Communication among each read/write stack 400 is effected by an interconnecting stack bus 431 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Figure 10:
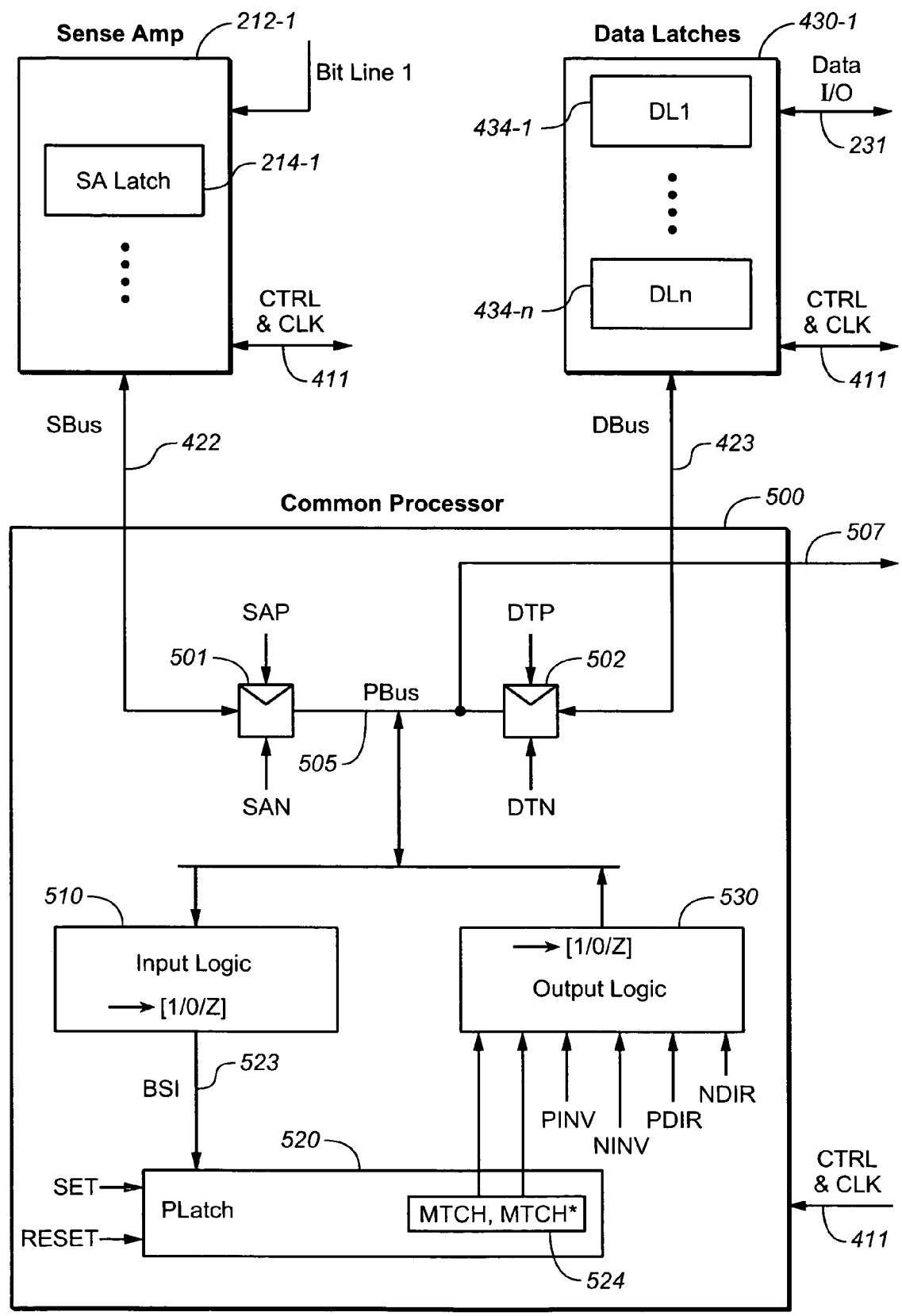
FIG. 10 illustrates an improved embodiment of the common processor shown in FIG. 9.

FIG. 10 illustrates an improved embodiment of the common processor shown in FIG. 9. The common processor 500 comprises a processor bus, PBUS 505 for communication with external circuits, an input logic 510, a processor latch PLatch 520 and an output logic 530.

The input logic 510 receives data from the PBUS and outputs to a BSI node as a transformed data in one of logical states "1", "0", or "Z" (float) depending on the control signals from the stack bus controller 410 via signal lines 411. A Set/Reset latch, PLatch 520 then latches BSI, resulting in a pair of complementary output signals as MTCH and MTCH*.

The output logic 530 receives the MTCH and MTCH* signals and outputs on the PBUS 505 a transformed data in one of logical states "1", "0", or "Z" (float) depending on the control signals from the stack bus controller 410 via signal lines 411.

At any one time the common processor 500 processes the data related to a given memory cell. For example, FIG. 10 illustrates the case for the memory cell coupled to bit line 1. The corresponding sense amplifier 212-1 comprises a node where the sense amplifier data appears. In the preferred embodiment, the node assumes the form of a SA Latch, 214-1 that stores data. Similarly, the corresponding set of data latches 430-1 stores input or output data associated with the memory cell coupled to bit line 1. In the preferred embodiment, the set of data latches 430-1 comprises sufficient data latches, 434-1, . . . , 434-n for storing n-bits of data.

The PBUS 505 of the common processor 500 has access to the SA latch 214-1 via the SBUS 422 when a transfer gate 501 is enabled by a pair of complementary signals SAP and SAN. Similarly, the PBUS 505 has access to the set of data latches 430-1 via the DBUS 423 when a transfer gate 502 is enabled by a pair of complementary signals DTP and DTN. The signals SAP, SAN, DTP and DTN are illustrated explicitly as part of the control signals from the stack bus controller 410.

Figures 11A, 11B:
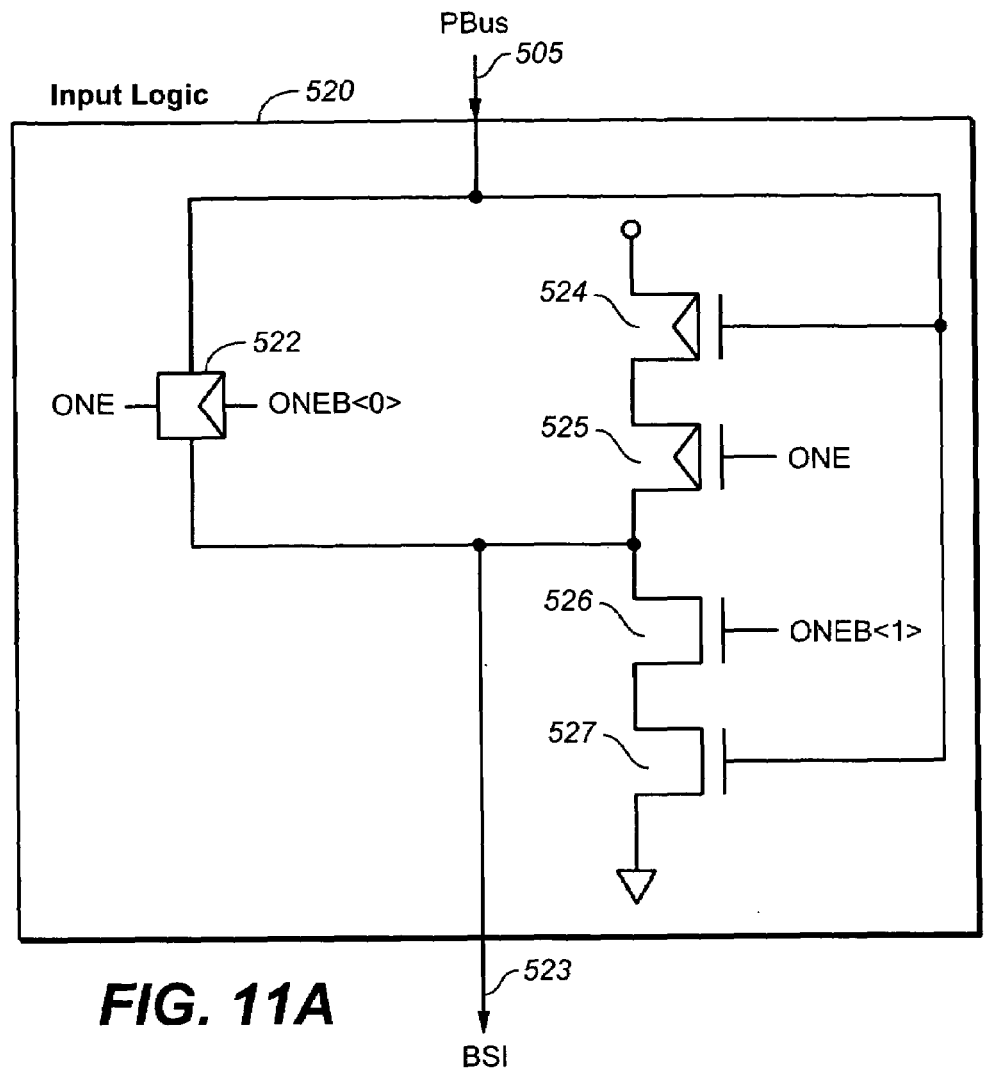
FIG. 11A illustrates a preferred embodiment of the input logic of the common processor shown in FIG. 10.
FIG. 11B illustrates the truth table of the input logic of FIG. 11A.

FIG. 11A illustrates a preferred embodiment of the input logic of the common processor shown in FIG. 10. The input logic 520 receives the data on the PBUS 505 and depending on the control signals, either has the output BSI being the same, or inverted, or floated. The output BSI node is essentially affected by either the output of a transfer gate 522 or a pull-up circuit comprising p-transistors 524 and 525 in series to $V_{dd}$, or a pull-down circuit comprising n-transistors 526 and 527 in series to ground. The pull-up circuit has the gates to the p-transistor 524 and 525 respectively controlled by the signals PBUS and ONE. The pull-down circuit has the gates to the n-transistors 526 and 527 respectively controlled by the signals ONEB<1> and PBUS.

FIG. 11B illustrates the truth table of the input logic of FIG. 11A. The logic is controlled by PBUS and the control signals ONE, ONEB<0>, ONEB<1> which are part of the control signals from the stack bus controller 410. Essentially, three transfer modes, PASSTHROUGH, INVERTED, and FLOATED, are supported.

In the case of the PASSTHROUGH mode where BSI is the same as the input data, the signals ONE is at a logical "1", ONEB<0> at "0" and ONEB<1> at "0". This will disable the pull-up or pull-down but enable the transfer gate 522 to pass the data on the PBUS 505 to the output 523. In the case of the INVERTED mode where BSI is the invert of the input data, the signals ONE is at "0", ONEB<0> at "1" and ONE<1> at "1". This will disable the transfer gate 522. Also, when PBUS is at "0", the pull-down circuit will be disabled while the pull-up circuit is enabled, resulting in BSI being at "1". Similarly, when PBUS is at "1", the pull-up circuit is disabled while the pull-down circuit is enabled, resulting in BSI being at "0". Finally, in the case of the FLOATED mode, the output BSI can be floated by having the signals ONE at "1", ONEB<0> at "1" and ONEB<1> at "0". The FLOATED mode is listed for completeness although in practice, it is not used.

Figures 12A, 12B:
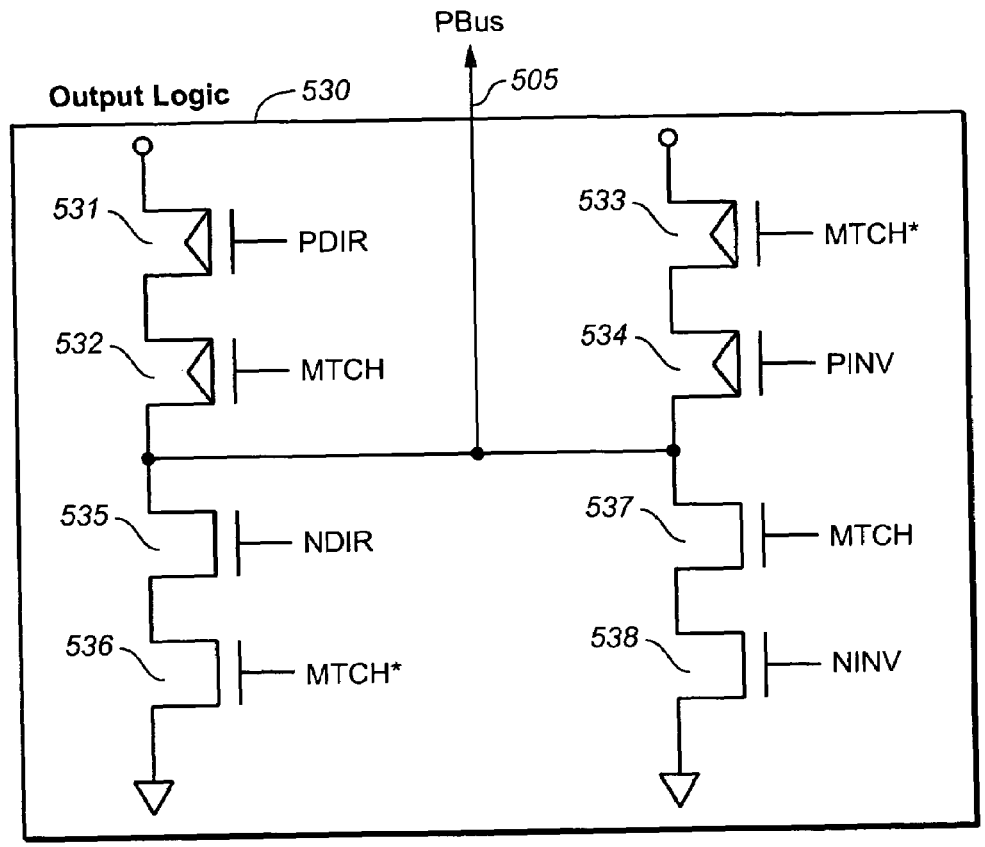
FIG. 12A illustrates a preferred embodiment of the output logic of the common processor shown in FIG. 10.
FIG. 12B illustrates the truth table of the output logic of FIG. 12A.

FIG. 12A illustrates a preferred embodiment of the output logic of the common processor shown in FIG. 10. The signal at the BSI node from the input logic 520 is latched in the processor latch, PLatch 520. The output logic 530 receives the data MTCH and MTCH* from the output of PLatch 520 and depending on the control signals, outputs on the PBUS as either in a PASSTHROUGH, INVERTED OR FLOATED mode. In other words, the four branches act as drivers for the PBUS 505, actively pulling it either to a HIGH, LOW or FLOATED state. This is accomplished by four branch circuits, namely two pull-up and two pull-down circuits for the PBUS 505. A first pull-up circuit comprises p-transistors 531 and 532 in series to $V_{dd}$, and is able to pull up the PBUS when MTCH is at "0". A second pull-up circuit comprises p-transistors 533 and 534 in series to ground and is able to pull up the PBUS when MTCH is at "1". Similarly, a first pull-down circuit comprises n-transistors 535 and 536 in series to $V_{dd}$, and is able to pull down the PBUS when MTCH is at "0". A second pull-up circuit comprises n-transistors 537 and 538 in series to ground and is able to pull up the PBUS when MTCH is at "1".

One feature of the invention is to constitute the pull-up circuits with PMOS transistors and the pull-down circuits with NMOS transistors. Since the pull by the NMOS is much stronger than that of the PMOS, the pull-down will always overcome the pull-up in any contentions. In other words, the node or bus can always default to a pull-up or "1" state, and if desired, can always be flipped to a "0" state by a pull-down.

FIG. 12B illustrates the truth table of the output logic of FIG. 12A. The logic is controlled by MTCH, MTCH* latched from the input logic and the control signals PDIR, PINV, NDIR, NINV, which are part of the control signals from the stack bus controller 410. Four operation modes, PASSTHROUGH, INVERTED, FLOATED, and PRECHARGE are supported.

In the FLOATED mode, all four branches are disabled. This is accomplished by having the signals PINV=1, NINV=0, PDIR=1, NDIR=0, which are also the default values. In the PASSTHROUGH mode, when MTCH=0, it will require PBUS=0. This is accomplished by only enabling the pull-down branch with n-transistors 535 and 536, with all control signals at their default values except for NDIR=1. When MTCH=1, it will require PBUS=1. This is accomplished by only enabling the pull-up branch with p-transistors 533 and 534, with all control signals at their default values except for PINV=0. In the INVERTED mode, when MTCH=0, it will require PBUS=1. This is accomplished by only enabling the pull-up branch with p-transistors 531 and 532, with all control signals at their default values except for PDIR=0. When MTCH=1, it will require PBUS=0. This is accomplished by only enabling the pull-down branch with n-transistors 537 and 538, with all control signals at their default values except for NINV=1. In the PRECHARGE mode, the control signals settings of PDIR=0 and PINV=0 will either enable the pull-up branch with p-transistors 531 and 531 when MTCH=1 or the pull-up branch with p-transistors 533 and 534 when MTCH=0.

Common processor operations are developed more fully in U.S. patent application Ser. No. 11/026,536, Dec. 29, 2004, which is hereby incorporated in its entirety by this reference.

Quick Pass Write in All Bit Line Architectures

An important aspect in the performance of non-volatile memories is programming speed. This section discusses methods of improving programming performance of multi-state non-volatile memories and is presented in the context of a NAND memory with an all bit line (ABL) architecture. Specifically, the use of the registers of common processor shown in FIG. 10 to implement quick pass write is described.

The goal in programming a memory is to write the data quickly, but with precision. In a binary memory, it is only necessary to write all of the programmed states above a certain threshold level, while the unprogrammed stay below. In a multi-state memory, the situation is more complicated since, for the intermediate states, a level must be written above a certain threshold, but not too high or its distribution will impinge upon the next level up. This problem is aggravated as the number of states increases, the available threshold window is reduced, or both.

The goal in programming a memory is to write the data quickly, but with precision. In a binary memory, it is only necessary to write all of the programmed states above a certain threshold level, while the unprogrammed stay below. In a multi-state memory, the situation is more complicated since, for the intermediate states, a level must be written above a certain threshold, but not too high or its distribution will impinge upon the next level up. This problem is aggravated as the number of states increases, the available threshold window is reduced, or both.

Figure 13:
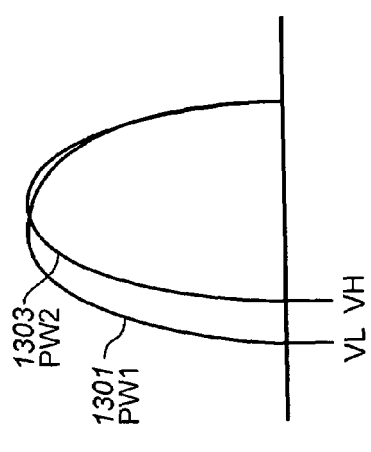
FIG. 13 shows two distributions of storage elements corresponding to the same memory state for a low and high verify level.
Figure 14:
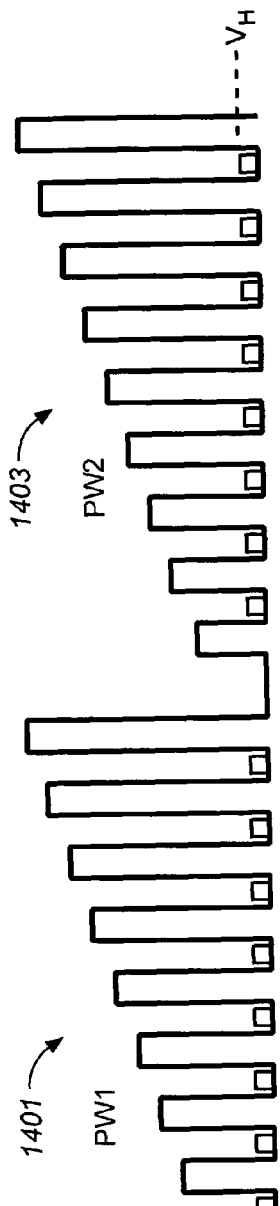
FIG. 14 illustrates an example of the programming waveform used in two pass write technique.

One technique to tighten the state distribution is by programming the same data multiple times. An example is the coarse-fine programming method described in U.S. Pat. No. 6,738,289, which is hereby incorporated by reference. FIG. 13 shows two distributions of storage elements corresponding to the same memory state, where in a first pass the cells have been written with a programming waveform PW1 using a first, lower verify level VL, producing distribution 1301. The programming waveform then starts over at lower value for the second pass. In the second pass, a programming waveform PW2 uses a second, higher verify level VH, to shift this to distribution 1303. This allows the first pass to place the cells into a rough distribution that is then tightened up in the second pass. A example of the programming waveform is shown in FIG. 14. The first staircase PW1 1401 uses the lower verify level VL, while PW2 uses the upper verify level VH. The second pass (PW2 1403) may use a small step size, as described in U.S. Pat. No. 6,738,289, but, aside from the different verify levels, the processes are the same.

Figure 15:
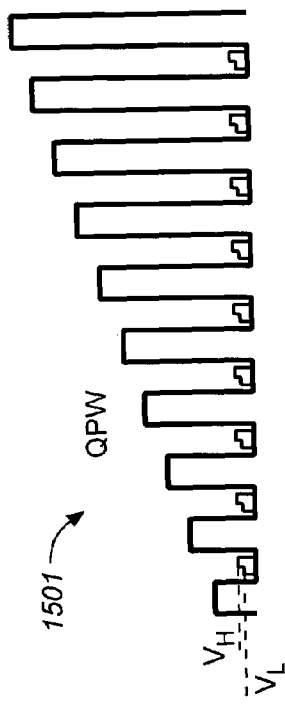
FIG. 15 illustrates an example of the programming waveform used in a quick pass write technique.

The shortcoming of this approach is that each programming sequence requires the programming waveform to go through both of the full staircases, executing 1401 and starting over with 1403. Writing could be executed more quickly if it were possible to use a single staircase, allowing for the distribution to be subjected to an initial programming phase based on a lower verify VL, but still be able to slow down the process once this initial level is reached and refine the distribution using the higher verify VH. This can be achieved through a "Quick Pass Write" that uses bit line bias to program in a single staircase sequence for the programming waveform. This algorithm can achieve a similar effect to that of a two-pass write and is described in more detail in U.S. Pat. No. 6,643,188, which is hereby incorporated by reference in its entirety. The programming waveform QPW 1501 is shown in FIG. 15 and, in a first phase, the process proceeds as for the first phase of the two-pass algorithm, except that the verify is performed at both the VL and VH level (see FIG. 18 for detail); however, once a verify at VL occurs, rather than restart the staircase waveform, the staircase continues, but with the bit line voltage raised to slow the process as it continues until the cells verify at VH. Note that this allows the pulses of the programming waveform to be monotonically non-decreasing. This is explained further with respect to FIG. 16.

Figure 16:
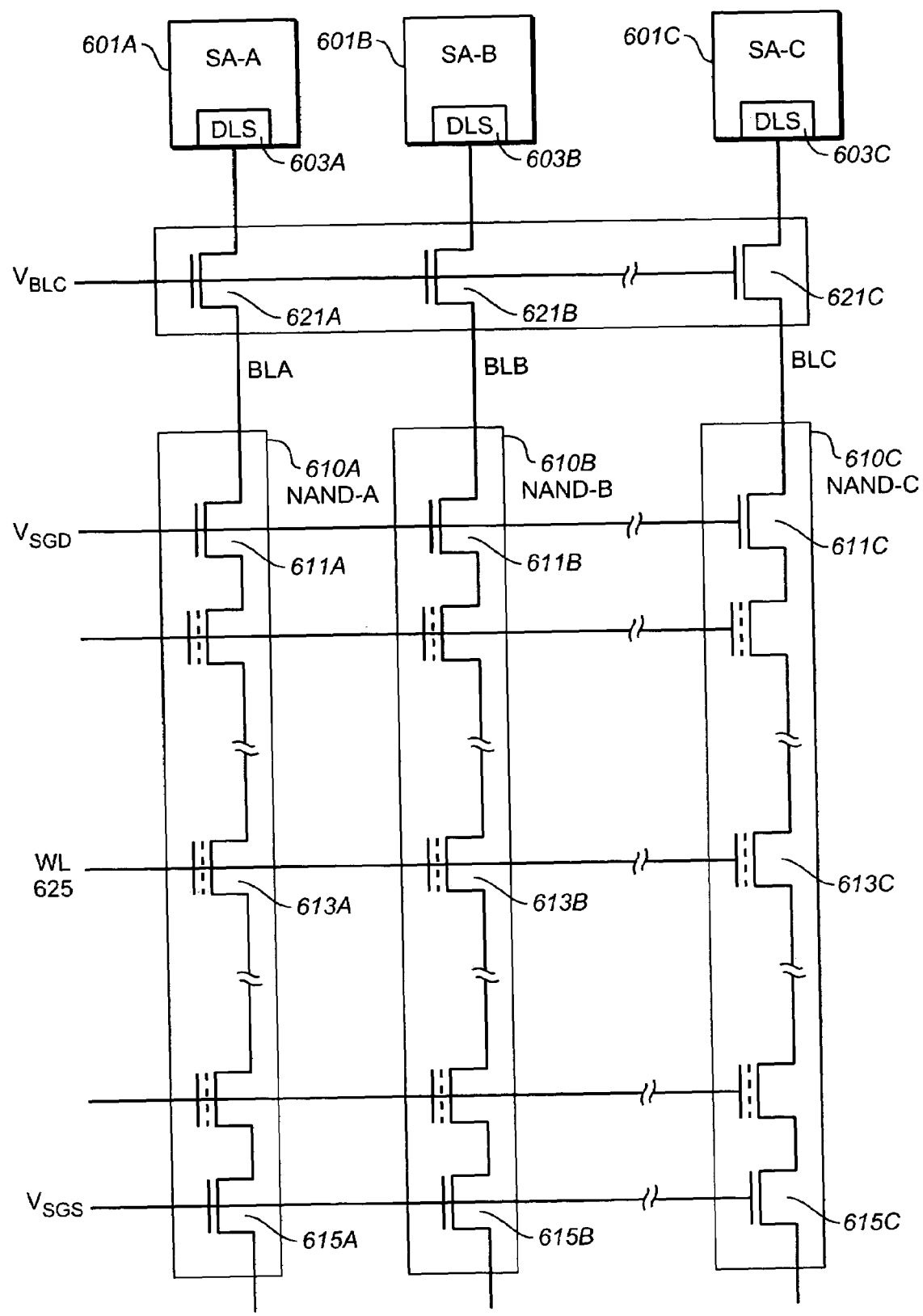
FIG. 16 shows a portion of a NAND-type array and its peripheral circuitry in the all bit line architecture.

FIG. 16 shows a portion of a NAND type array and its peripheral circuitry in the all bit line architecture. This is similar to the arrangement shown in a number of the preceding figures, but only the elements relevant to the present discussion are given here, with the other elements omitted to simplify the discussion. FIG. 16 also explicitly shows the bit line clamp 621 as separate from the other elements of the read/write stack. The details of the word line clamp are described further in a U.S. patent application entitled "Non-Volatile Memory and Method with Power-Saving Read and Program-Verify Operations" filed Mar. 16, 2005, and, particularly, numbered Ser. No. 11/015,199, filed Dec. 16, 2004, which are both incorporated by reference above. It should be noted that all though the present invention is discussed primarily in terms of a NAND type array using the all bit line architecture, the invention is not so limited. As will be seen in the following, the invention relates to a quick pass write, or more generally a two-phase programming process, and the use of data latches to monitor and control this process. So although this is described based on a particular embodiment for explanatory purposes, it can be applied far more generally.

FIG. 16 shows three NAND strings 610 A-C each connected along a corresponding bit line through bit line clamp 621 to a respective sense amplifier SA-A to SA-C 601 A-C. Each sense amp SA 601 has a data latch DLS 603 explicitly indicated, corresponding to SA Latch 214 above (e.g., FIG. 10). The bit line clamp 621 is used to control the voltage level and current flow along the bit line of the corresponding NAND string and the different clamps in a section of the array are commonly controlled by the voltage $V_{BLC}$. In each NAND string 610, source select gate (SGS 615) and drain select gate (SGD 611) are explicitly shown and are controlled, respectively, by $V_{SGD}$ and $V_{SGS}$ for the entire row. The row of cells (613) along word line WL 625 is used as the exemplary selected row for the following description.

The selected memory cells, such as 613A, are programmed by establishing a voltage difference between the control gate and channel, causing charge to accumulate on the floating gate. The programming waveform, QPW 1501 of FIG. 15, is applied along the selected word line WL 625. Consider the case where the cells along WL 625 are to be programmed in strings A and B, but not in string C. For cells to be programmed, such as cells 613A and 613B in rows A and B, the channel is held low (ground) to establish the needed potential difference. This is done by setting bit lines BL-A and BL-B to ground (corresponding to programmed data, "0") by the pull down circuits; turning on the bit line clamps 621 and drain side select transistors by setting $V_{BLC}=V_{SGD}=V_{dd}+V_T$, where $V_T$ is the appropriate threshold voltage; and turning off the source side select gates by taking $V_{SGS}$ low. This hold the channel in NAND-A and NAND-B to ground and the programming pulse at the gates of 613A and 613B will transfer charge to the floating gate.

For cell 613C, which is not to be programmed, or program inhibited, (corresponding to erased data or locked out data "1"), the same voltages are applied to the bit line clamp, select gates, and word line; however, based on the data "1" latched into the sense amp sets bit line BLC above the clamp 621-C to $V_{dd}$. As the gate of 621-C is at $V_{BLC}=V_{dd}+V_T$, this effectively shuts off transistor 621-C, allowing the channel of NAND-C to float. Consequently, when a programming pulse is applied to 613C, the channel is pulled up and inhibited from programming.

As described so far, this procedure is largely the same as would be done for the first pass of two-pass programming and for a standard single pass programming. In between programming pulses, a verify is performed. Whether a cell is to be programmed corresponds to the VH value of the target state. In a two-pass programming algorithm, the verifies of the first pass use the lower VL level, while those of the second pass uses the VH level. The present technique differs from the two-pass technique in that both the VL and the VH levels are used for the verifies are performed between pulses and in what happens once a cell verifies at this lower level. In the two pass technique, after a successful verify at the lower VL level, the programming waveform starts over but the verifies now use the VH level; here, the programming waveform continues, but the bit line biases are altered, being raised in order to slow down the programming rate. (In a variation of the quick pass write, the lower verify could be dropped, leaving only the VH verify, once the second phase begins. Similarly, on the first few pulses, the VH verify could be omitted. However, as this increases the complexity of the operation and the saving are relatively small, the present embodiment will include both the VL and VH verifies through out a given write process.)

The procedures to set the bit line bias at the beginning of the program pulse is thus to use the program verify VH data in the data latches to set up the data in the sense amp latch 603-$i$ to charge bit line BL-$i$ to either 0 (to program selected cells) or $V_{dd}$ (to inhibit non-selected cells), where the bit line clamp has already been set at $V_{BLC}=V_{dd}+V_T$ to allow bit line charge up to the full $V_{dd}$ value on non-selected bit lines. The bit line value can then be raised by moving voltage $V_{BLC}$ on the bit line clamps 621-$i$ from $V_{BLC}=V_{dd}+V_T$, where the transistors 621-$i$ are fully on, to $V_{BLC}=V_{QPW}+V_T$, where $V_{QPW}$ is less than $V_{dd}$. Once one of the cells verifies at the VL level for the target state and this result is then transferred back to the sense amp latch 603-$i$, the bit line voltage level is then raised. For the selected bit lines, this raises the bit line from ground to $V_{QPW}$, slowing programming; for the inhibited bit lines, these remain floating. The non-selected cells will still be program inhibited, but the channel in the selected NAND strings will raise somewhat, slowing down the programming rate even though the programming voltage waveform supplied along WL 625 continues to ascend the staircase.

Once the bit line voltage is raised, the second phase continues along the same programming waveform, but the inter-pulse verifies use the higher VH level of the target state. As the cells individual verify, they are locked out as the corresponding latch DLS 603 flips and the bit line is raised to $V_{dd}$. The process continues until the entire page is finished writing.

Figure 17:
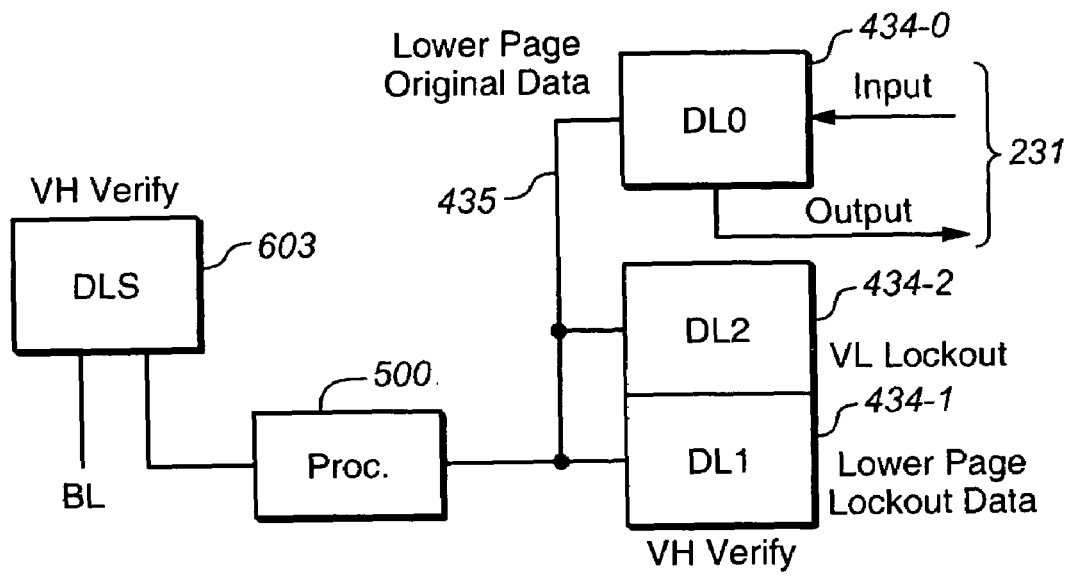
FIG. 17 describes the use of the data latches of FIG. 10 to implement quick pass write for a lower data page.

FIG. 17 describes the use of the data latches 434-$i$ of 430 (FIG. 10) of the exemplary all bit line architecture to implement this process. FIG. 17 reproduces only selected items of FIG. 10, arranged in an exemplary topology, in order to simplify discussion. These include data latch DL0 434-0, which is connected Data I/O line 231, data latch DL1 434-1, connected to common processor 500 by line 423, data latch DL2 434-2, commonly connected with the other data latches by line 435, and sense amp data latch DLS 603 (equivalent to 214 of FIG. 10), which is connected to common processor 500 by line 422.

Although only two data bits are programmed into each memory storage element, each bit line has three associated data latches. (In the more general n-bit case, the number of data latches would be n+1). The introduction of the extra latch, DL2 434-2, is used to manage which of the two programming phases the quick pass write algorithm is executing. As described above, and in the other incorporated references, the data latches DL0 434-0 and DL1 434-1 are used for writing the two bits of data into the cell based upon the "standard" verify level VH: when the lower page is being programmed, only one of this latches is strictly required, but when the upper page is being programmed one of these latches is used for the data of the upper page and the other for the previously programmed lower page, since the programming of the upper page depends upon the state of the lower page in this arrangement. By introducing the additional latch, DL2 434-2, a latch can be used to indicate the result of a verify at the lower VL level, upon which the change from the first phase of the quick pass write, where the channel a selected element is held low, to the second phase, where the channel level is raised to slow programming.

In FIG. 17 the registers 434-$i$ are labeled for the quick pass write of the lower page, which is implemented similarly to the case for a binary memory. The lower page original data is loaded along I/O line 231 to DL0 434-0, transferred into DL1 434-1 that serves for VH verify, and subsequently transferred into DLS 603 where it is used to determine whether the bit line is program enabled or inhibited. Latch DL2 434-2 is used for VL lockout.

Figure 18:
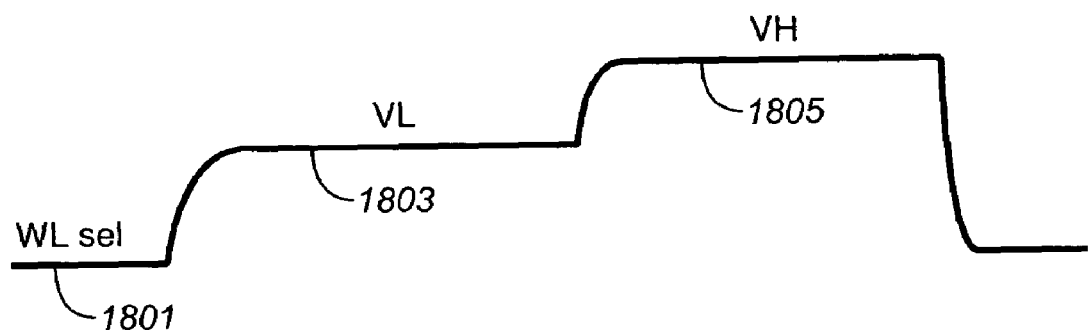
FIG. 18 shows an exemplary verify waveform to illustrate the two verify levels.

Program verify can be performed between programming pulses with a waveform such as shown in more detail in FIG. 18 applied to the selected word line WL 625. The waveform is raised from ground (1801) to the first, lower verify level VL (1803) and then further raised to the higher VH (1805). The other voltage levels on the array are at typical read values as described in the references incorporated above. This allows the two program verifies to be done consecutively according to the following steps:

(1) A first verify level uses the lower verify level VL (1803), with the data then being transferred to data latch DL2 434-2.

(2) The second verify is higher verify level performed when the verify waveform is at 1805. The result of VH will be transferred to data latch DL1 434-1. During the program pulse, the bit line bias setup will depend both of the VL and VH verify results.

(3) The VH verify result is transferred to SA data latch DLS 603 to charge bit lines to either 0 or $V_{dd}$.

(4) The VL verify result in NDL is transferred to SA data latch DLS 603 to charge bitlines from 0 to $V_{QPW}$ (if the cell verified), or to keep the bit line at 0 (if the data is "0"). The process is described in more detail in the flowchart of FIG. 19.

Figure 19:
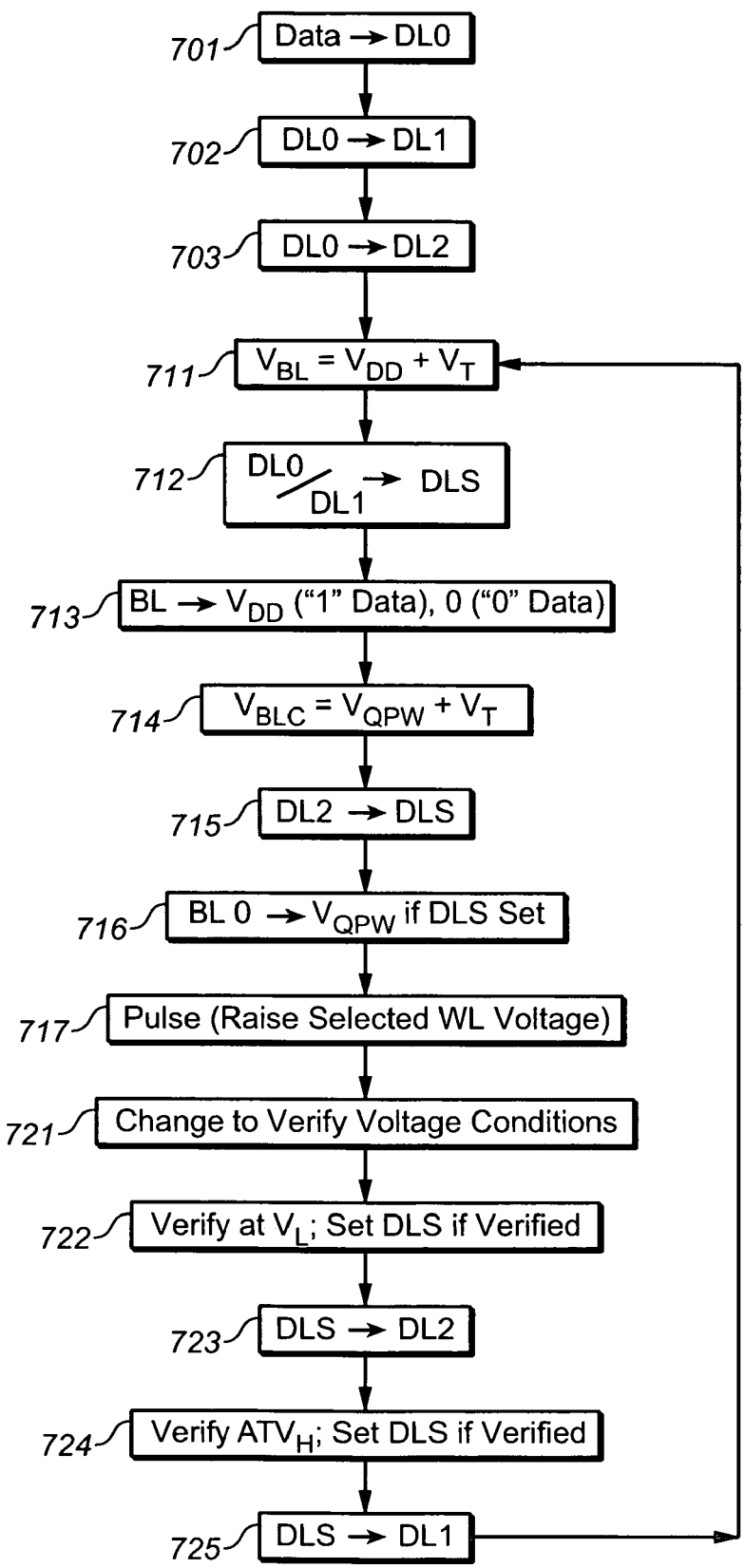
FIG. 19 is a flowchart for a quick pass write algorithm.

FIG. 19 is a flowchart of the program/verify sequence based on the latches of the read/write stacks of the exemplary all bit line embodiment. The initial condition of the data latches is established in steps 701-703, the program bias conditions are set and the program waveform is applied in steps 711-717, and the verify phase is in steps 721-725. The order here is that of an exemplary embodiment and order of many steps can be rearranged, as long as, for example, the correct bias levels are established before the word line is pulsed. In step 701 data is read in on line 231 into latch DL0 434-0 and subsequently transferred to latch DL1 434-1 in step 702. In step 703 it is further transferred into latch DL2 434-2. This sets the target data for the write process, where the convention used is that where a value of "0" corresponds to program and a value of "1" to program inhibit.

The programming phase begins by setting the correct bias conditions based on the latches. In step 711, the voltage to bit line clamp line is set at $V_{dd}+V_T$, the normal programming levels of the first phase of quick pass write, and, in step 712 the value held in latch DL0/DL1 is transferred to into latch DLS 603 of the sense amp, where a value of "0" (program) will result in the bit line held at ground and a value of "1" (inhibit) will effect a bit line value of $V_{dd}$. This (step 713) will set the voltage to the bit line clamp lines at $V_{dd}+V_T$ so that the channels along the selected bit lines are held at ground for programming and the channels along the non-selected bit lines are left to float in order to inhibit programming. In step 714 the clamp voltage is lowered from $V_{BLC}=V_{dd}+V_T$ to $V_{BLC}=V_{QPW}+V_T$. The value in DL2 434-2, is transferred to sense amp data latch DLS 603 in step 715. In the first cycle through, this will be the initial value set in DL2. Once the cell verified at VL, the lowered $V_{BLC}$ value set in step 714 will then cause the bit line level to be raised from 0 to $V_{QPW}$ in the cells being programmed, thereby slowing the programming rate and transitioning to the second quick pass write phase.

In step 717, the programming pulse (QPW 1501, FIG. 15) is applied to the selected word line WL 625, the bias on the other lines having been established in the preceding steps. The inter-pulse verify phase begins at step 721 when the various bias voltages on are established prior to raising the selected word line to VL. In step 722, the word line's verify waveform raises to the lower margin VL (1803 FIG. 18) and, if the cell verifies, the latch in sense SA 601 trips and the value in DLS 603 switches from "0" to "1", the result then being transferred by the common processor 500 to DL2 434-2 in step 723. In step 724 the verify level is then raised to the higher margin VH (1805) and if the cell verifies DLS 603 is set, the result then being transferred by the common processor to DL1 434-1 in step 725.

The verify phase having been completed in steps 721-711, the common processor 500 needs to re-establish the bias conditions in the sense amp data latches for the subsequent pulse; unless, of course, all the cells being programmed lock out at VH or the program phase is otherwise terminated. This is done by looping back to step 711. In step 712, the VH verify result as indicated by the value now in DL1 434-1 is transferred; if the cell verified at VH, it will be program inhibited and the sense amp bit is changed form "0" to "1" to take the bit line high and inhibit further programming. The VL verify result, as now indicated by the value in DL2 434-2, is transferred to sense amp data latch DLS 603 in step 715; if the cell verified at VL, the bit line voltage is then raised in step 716.

The data latches being properly set, the next programming pulse is applied at step 717. The process then continues as before; alternately, the process could alter the verify waveform in FIG. 18, for example, and by eliminating the lower verify and steps 722 and 723 once it is no longer needed.

The preceding description has been for the lower page of an upper page/lower page arrangement, where each memory cell stores two bits of information, one corresponding to the upper page and one corresponding to the lower page. The process would proceed similarly to that already described for both the binary case and the first programmed page of other higher multi-page arrangements. The rest of the discussion will be also based on the two bit per cell, upper page/lower page embodiment as this illustrates the multi-state case while not adding unnecessary complications that the storage of more states would introduce. For multi-state memories using the multi-page format, a number of encodings of the pages onto the states of the cells are possible and several of these will be discussed for the exemplary upper page/lower page arrangement. Further detail of these different encoding, how they can be implemented, and their relative advantages are discussed in U.S. patent application entitled "Non-Volatile Memory and Method with Power-Saving Read and Program-Verify Operations" filed Mar. 16, 2005, incorporated by reference above.

Figure 20:
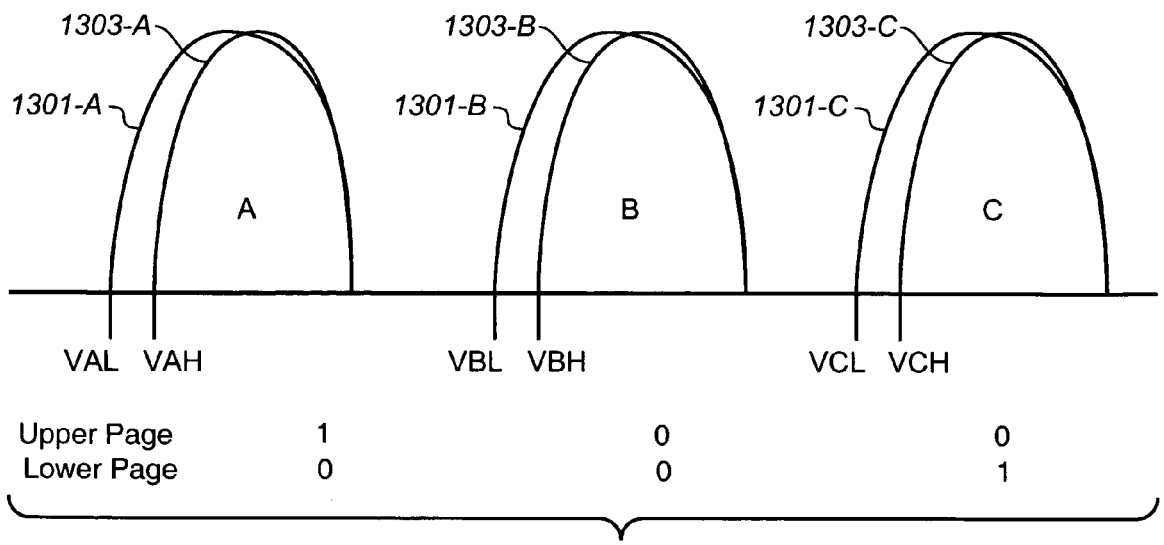
FIG. 20 shows a distribution of memory cells for a conventional two page coding.

The programming of the upper page of data using quick pass write is first described using "conventional code", where the upper page write is to program the B and C states, which then uses two program verify cycles. The state A was programmed in the lower page operation described in the preceding. The relation of the distributions for the A, B, and C states are shown in FIG. 20. The unprogrammed E distribution, corresponding to data "11", is not shown in this figure.

FIG. 20 shows a first distribution 1301 and a second distribution 1303 respectively corresponding to each state's lower verify VL, used in the first programming phase of the quick pass write, and higher verify VH, used in the second phase. The "conventional" coding of these programmed states into upper and lower page data is given under the distributions. In this coding, the states with lower page data "0" will have been programmed to the 1303-A distribution using the levels VAL and VAH in a quick pass write when the lower page was programmed as previously described. The upper page write is to program the B and C states.

Figure 21:
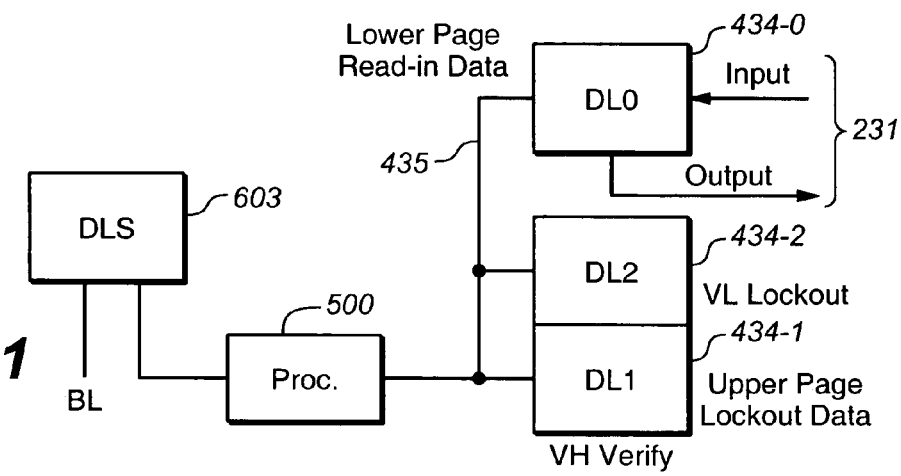
FIG. 21 describes the use of the data latches of FIG. 10 to implement quick pass write for an upper data page in conventional coding FIG. 22 describes the use of the data latches of FIG. 10 to implement quick pass write for full sequence programming.

The use of the data latches DL0-DL2 is described with respect to FIG. 21, which is similar to FIG. 17, but with the notation indicating the use of the different latches changed accordingly. As indicated there, the lower page data is read in to DL0 434-0, DL1 434-1 is used for the upper page lockout data and will receive the VH verify result, and DL2 434-2 is again used to hold the VL lockout data. As with the lower page write, one latch is assigned for each of the two verify levels, with DL1 for the actual, higher verify result and DL2 for the lower verify result used to effect the phase transition of the quick pass write.

More specifically, the VL lockout information will be accumulated in data latch DL2 434-2, with its initial value again transferred in from DL1 434-1 and corresponding to the original program data to indicate if the cell is to undergo upper page programming. In the present embodiment, the bit line bias for the B and C state's quick pass write is the same; in a variation, additional latches can be introduced to allow the B and C states to employ different bias levels. Also, VL lockout information is only used for temporary storage. The data in the data latch DL2 434-2 for VL will be changed from "0" to "1" after passing each VL verify sensing. The logic is such that it will not allow a "1" value to flip back to "0" during a given programming run.

The VH lockout is also accumulated through many different verify sensing. As soon as the bits passed verify level of its intended program state, the data in the data latch will be changed to "11". For example, if the B state passed verify VBH, then the data in data latch "00" will be changed to "11". If the C state passed verify VCH, then the data in data latch "01" will be changed to "11". The logic is such that it will not allow a "1" value to flip back to "0" during a given programming run. Note that for upper page programming, VH lockout may occur based on only one data latch.

U.S. patent application Ser. No. 11/013,125 filed Dec. 14, 2004, describes a method where the programming of multiple pages held by the same set of multi-state memory elements can be overlapped. For example, if while writing a lower page the data for the corresponding upper becomes available, rather than wait for the lower page to finish before beginning to program the upper page, the write operation can switch to a full programming sequence where the upper and lower pages are programmed concurrently into the physical page. The quick pass write technique can also be applied to the full sequence operation.

Figure 22:
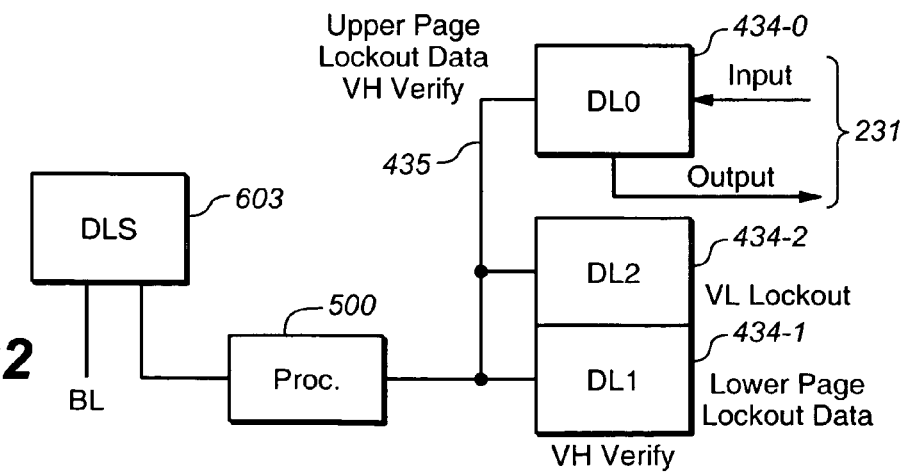

FIG. 22 shows the use of the data latches DL0-DL2 for the full sequence write and is similar to FIG. 17, but with the notation indicating the use of the different latches changed accordingly. As shown there DL0 434-0 is used for the upper page lockout data and will receive the corresponding VH verify result, DL1 434-1 is used for the lower page lockout data and will receive the corresponding VH verify result, and DL2 434-2 is again used to hold the VL lockout data. Unlike in single page programming, where the initial DL2 434-2 value corresponds to the initial program data, the initial value at the time of the full sequence transition will account for the upper and lower page data. Consequently, rather than also just loading the appropriate, single page original program data into DL2 434-2, it is now only set to "1" if both of the latches DL0 and DL1 are "1".

In an exemplary embodiment, the full sequence operation with quick pass write can include the following steps:

(1) The first page data is loaded into latch DL0 434-0 and the lower page can start programming as described above.

(2) As described above for lower page programming, one the lower page program data has been transferred to latch DL1 434-1, latch DL0 434-0 can be reset and be ready to sequentially load another page, allowing the upper page on the same word line WL 625 to transferred in when available.

(3) After the upper page data is finished loading, the programming of the lower page will likely not be done. In this case, the program algorithm can be converted to program two bits at the same time, according to the full sequence programming described in U.S. patent application Ser. No. 11/013, 125, to accelerate the program speed. If upper page data was not available or otherwise not loaded prior to the writing of the page being completed, the upper page will be programmed by itself as described above.

(4) Before the conversion form lower page program to full sequence conversion, the lower page original data may have been locked out to ""11"" for cells that passed program verify A. These data should be read at the A level to recover their original data, since the two-bit full sequence write needs both the lower and the upper page data to program.

(5) In this two-bit full sequence program algorithm, the program verifies for the A, B, and C states can be performed at the same time or separately. The lockout process can also lockout the both latches at the same time.

(6) After program data A and B are finished, only the C state remains to be programmed so that the process resembles a binary write. The remaining program data can be transferred to DL1, allowing DL0 to be reset to "1" for the next page of data to be loaded.

Figure 23:
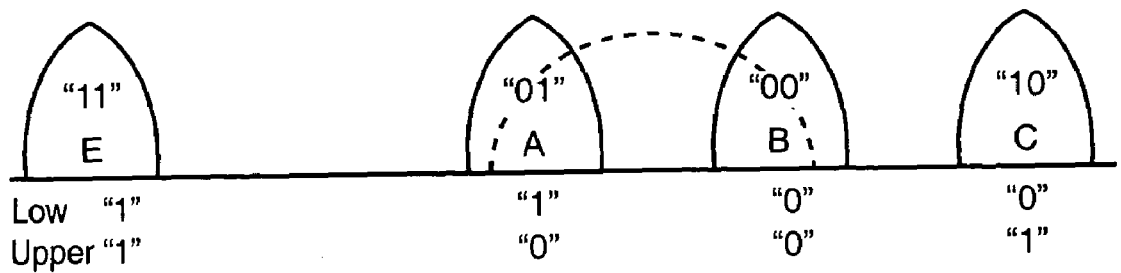
FIGS. 23 and 24 shows a distribution of memory cells for alternate two page codings.
Figure 24:
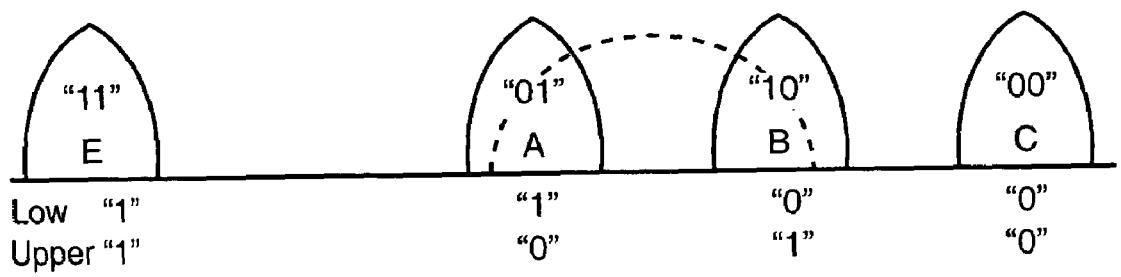

The preceding discussion of upper page programming using quick pass write was based on the conventional encoding of the states E, A, B, and C into upper and lower pages, as is shown in FIG. 20. As developed more in U.S. patent application entitled "Non-Volatile Memory and Method with Power-Saving Read and Program-Verify Operations" filed Mar. 16, 2005, other encodings are often useful. Two examples are shown in FIGS. 23 and 24, the first of these showing the "LM old" code and the second showing the "LM new" code. In both cases, the broken line indicates an intermediate state's distribution that is the result of the lower page program, with the lower page write using quick pass write in both LM codes done similarly to the lower page program described above. The upper page program then moves cells from the intermediate distribution to a final target state of either the B or C distribution and programs cells with "01" data from the "11" state's E distribution into the A distribution. The upper page write using quick pass write in both LM codes is done similarly to the upper page program described above for the conventional code, the difference being that lower page will also lockout as the state B and state C are coming from intermediate state (dotted line).

For both versions of the LM code, quick pass write is done in the same way, but with the verification of states switched so that B_new=C_old and B old=C_new due to the differing assignment of the two bits to the four states. This change, as with the change from the conventional coding, is effected by the common processor 500. The data transfer logic through common processor 500 will depend on the code and therefore it will be different.

The upper page program algorithm for the LM codes is also similar to the full sequence quick pass write algorithm in that both VH lockout data are updated after the VH verify. For the LM old code, the upper page is also the same as in the conventional code if the lower and upper page codes are switched, in which case the upper page in the LM old code is the same as full sequence program.

FIG. 25 again shows the data latches and their assignment for the LM codes in a manner similar to FIG. 22 and other similar figures above. Lower page data is read into DL0 434-0, the upper page lockout data based on VH is held in DL1 434-1, and DL2 434-2 is again assigned the VL lockout data used to control the phase shift for the quick pass write technique.

As there is no additionally state above the C state, the situation is similar to the binary case in that the important outcome is that the C distribution is sufficiently well defined from the distribution below it, but over-programming is not a major concern (at least as far as state determination). Consequently, it may be preferred to use the quick pass write for the A and B states, but not for the C state, instead using only the VH level of this state. (For memories having other numbers of states, these comments apply to the highest lying, or rather most programmed, state.)

For example if all three states are using quick pass write, the implementation of the program and verify is often simpler that they are done in the same way for all three states; however, since the C state distribution can be wide and still have acceptable margins, quick pass write can be omitted for the C state in order to reduce programming time.

As noted, using quick pass write (QPW) for the lower states but not using quick pass write for the C state can complicate the programming algorithms. For example, at certain point of the write process, a program pulse is followed by verify A (with QPW), verify B (with QPW), and verify C (no QPW), which is then followed by another program pulse. Since the quick pass write algorithm describe above uses two data transfers for program pulse (a first data transfer to lockout VH and a second data transfer to lockout VL), the first data transfer will have no problems for all three states; but the second transfer will, under the above arrangements, result in a program error for state C. Since state C will not do verify VCL at the lower level, then the DL2 434-2 data latch is not updated for this bit line. If this bit line needs to be locked out after passing the high VCH verify level for C, the VH lockout data latch will transfer "1" to the SA data latch for program inhibit after the first data transfer. However, the VL data latch (DL2 434-2) will still hold data since there is no verify result to update it. Therefore, the second data transfer will transfer a "0" to the DLS 603 of the bit line. This would result in the pre-charged bit line being discharged to 0, causing this bit line to over-program.

To overcome this problem, when quick pass write is not being used for the C state, the algorithm is modified by updating the VL data latch (DL2 434-2) with a C verify at the high level of VCH. Thus, if the cell passes verify for the C level at VCH, then both VH and VL lockout data will be changed to "1" and programming will be inhibited. Also, if the both the A and B states are finished writing while the C state is not, the program algorithm can switch to standard programming with no quick pass write, or no QPW algorithm, as only the C state is left and it will only use the corresponding VH verify level. In this case, only a single data transfer (of the VH level, the VL level not being used) will be done Data Recovery After Program Failure In multi-state memories, one way of storing data is to write the memory as independent pages, such that (in the four state example) each 2-bit memory cell stores a bit from an upper page and a bit from the lower page. The common arrangement is to write a lower page of data and some time later, in a separate process, to write the upper page. When the programming of the upper page fails, the data content of the lower page data is also lost. In a principle aspect of the present invention, both lower and upper page data can be recovered and copied to another location without having to maintain a copy of the data buffer on the controller or with other help from the controller. This allows for the buffers on the controller to freed up for other data or to reduce the amount of buffer on the controller, which can be valuable space, to be reduced. In particular, the process can be accomplished on the memory by the state machine (312, FIG. 7A) in the memory's control circuitry (310) and data latches (430, FIGS. 8 and 15) in the sense amplifier area. It should be noted that although the description is based on this particular embodiment, the aspects of the present invention discussed in this section relies only on the data latches DL0 434-0 and DL1 434-1, corresponding to the two bits stored per cell in the exemplary embodiment, and do not require the use of DL2 434-2. The resultant improves are even greater as the page size used in memory system continues to increases.

More specifically, when 2 bits or more bits are programmed on one physical cell, if the write fails, the same data should be able to be programmed to another location rather than being lost. The problem that arises when the two (or more) bits are arranged into independent pages is that the failure of one page to program will affect the data on the other page previously programmed onto the same physical location. For example, in the conventional code (FIG. 20), the upper page state "0" at C was from E state, so that if it fails to program to the C state, it may anywhere between the E state and the C state and the lower page information can also be lost. As the lower page may have been programmed much earlier as part of a different data set and the lower page information can also be lost.

Consider the conventional code example where the 2-bits are, arranged in two pages as shown in FIG. 26a. This figure shows an array or portion of an array 700 and several representative word lines, where the broken line indicating the two pages can be written in together in the exemplary all bit line architecture. Pages 0, 1 are the lower pages and 2, 3 are the upper pages word lines 701. (0, 1 are written above the line to indicate they are written first, somewhat contrary to how they are named.) If the page 2, 3 are then programmed with errors beyond the ability of the ECC to repair, not only does the page 2, 3 data need to be programmed, but also the page 0, 1 data will need to be re-programmed to another location.

Lower-Middle (LM) code (FIGS. 23 and 24) is designed to reduce bit line to bit line and word line to word line coupling effects. The page arrangement is shown in FIG. 26b. The upper page sharing word line 701 with page 0, 1 is now 4, 5 instead 2, 3 in this case. When page 4, 5 are written with error and fail to verify, page 0, 1 will also need to be corrected. Since the page numbers for upper pages are not sequential with the lower pages on the same word line, users will not have kept the lower page information to enable these pages re-programmed.

The LM lower page is also destroyed by the upper page program failure, as can be seen by referring to FIG. 24. This is caused by the initial programming of lower page not to B level, but to distribution having the broken line A level. If the lower page is initially programmed to B verify level, then the upper page failure would not affect the integrity of the lower page data, but the advantage of fast lower page program will be eliminated. It would again be a great advantage if the lower page data can be recovered even the upper page program failed. If the upper page program data is still in the controller data buffer, and if the lower page is reserved, it can be combined and copied to another good WL. The bad data will be for the whole word line, which can be marked as bad (using a flag). However, this does require maintaining the data on the controller. FIG. 27 shows this schematically.

FIG. 27 is a schematic drawing showing the flow of data as it is received from a host and programmed into the memory array 300. The data is first received at the controller 801 (as is usually distinct from the control circuitry 310 (FIG. 7A) on the memory 811), which contains some amount cache memory 803 used to buffer the data as it collected and then transferred on to the memory 811. As such buffer memory is typically expensive in terms of space of cost and area, it is preferable to not have more of such memory than is needed; however, such is the required needed for such buffering in typical memory operations that a significant portion of controller space may be given over to buffer memory. This particularly true as page size increases. From the controller 801, the data is then transferred into memory 811 to the data latches of the read/write circuits 370 from where it can be written into the memory array 300.

Under previous arrangements, to ensure data integrity in case of program failure, a copy of the data would need to be maintained on the controller in the buffers 803 since the copy in the latches of the write circuits 370 is lost in the write process. According to one main aspect of the present invention, based upon the remaining content of the latches combined with one or more read processes, the data is able to be reconstructed on the memory 811 without resort to maintaining a copy in the controller 801. The reconstituted data can then be written to another location of the array 300. This allows the buffers 803 to freed up for new data or other uses, or even reduced in quantity as not as much data needed to be maintained in them.

The basic process is described in U.S. patent application Ser. No. 11/013,125, filed Dec. 14, 2004, that is incorporated by reference above and of which the present application is a continuation in part. The "Overlapped Programming of Upper and Lower MLC Pages" section that application describes the ability to switch from writing only lower page data to the concurrent writing of both upper and lower page data. As described there, and developed further below, even if there is a program failure during the subsequent programming of state C and we need to rewrite the data, the controller does not need to transfer new data for page n to the memory; we still have the lower page data, and we can recover the upper page data by simply reading the state of the cell using a $V_{RB}$ threshold (see FIG. 10C). In this event, an error would be reported to the controller, the received data for lower page n+1 would be discarded, and the recovered data for page n would be written to a new location as directed by the controller.

Returning first to the conventional code (FIG. 20) and when the lower page is written first followed by the upper page, an exemplary embodiment of the data recovery process is described.

The latch assignment in single page program mode is shown in FIG. 28. In the single page program mode in conventional code, latch DL0 434-0 is used to hold the lower page data from sensing the lower page before starting the upper page program. The case of upper page failure due to very slow bits can be dealt with in several ways:

1) this lower page information can be toggled out;
2) it can be transferred to DL1 434-1, and then programmed to another word line; or
3) the corresponding upper page in the controller's buffer 803 can be shifted in to the read/write circuits 370 and 2-bit programming (full sequence program) can be started in the next word line.

To save the data transfer time, it is usually preferred that the upper page data is also recovered after the upper page program failure.

FIG. 29 shows the case where lower page data is under programmed and will be used as a first example of data-recovery. If the memory was to have been programmed to the A state (lower page data "0"), a successful write will have verified at A states verify level and placed it somewhere in the A distribution. If the cell fails to verify, it may be anywhere between the E state distribution and the lower end of A distribution. When read with the value readA, it may still read as an A state (returning a "1" to the sense amp) if it is above readA even if it failed to verify. If instead it was left somewhere below readA level (as shown by the X), the sense amp will return a "0" and the cell will read, incorrectly, as the E state. The process is summarized in the table of FIG. 30, which assumes that the data NOT programmed (that is, failed to verify) will have "0" remaining in the data latch, as shown in line (1). If the cell had finished programming, and successfully verified, it would instead have "1" in the data latch.

In FIG. 30 the top line corresponds to the lower page data to have been written into the cell and assume that there was a write failure so that some cells to have been written to the A state are left below the readA, as shown by the X of FIG. 29. The data recovery begins with normal readA logic, DL1 434-1=~SA, with line (2) of FIG. 30 showing the result. (This discussion assumes that DL1 434-1 is the data latch holding the program lockout information and the notation is that ~SA means reverse of SA data and "&" means a logic AND. As X is below readA, line (2) reads 1 for both target data states. The recovered data (line (3)) is the logical AND of lines (1) and (2): DL1 434-1=SA & DL1 434-1.

In the case of upper page program failure, it is necessary to consider under programming for both the B and C state. The recovery of upper page data uses the same logic to correct both B and C errors in conventional code and is shown in FIG. 31. The process assumes that the lower page finished writing correctly. Although the lower page will be corrupted by the upper page failure, the lower page good data is still intact because it is read latch at the prior to the upper page program. Consequently, it is just necessary to recover the upper page and then both lower and upper pages can be re-programmed somewhere else.

The standard read process for the B state is given by:

Normal readB: DL1=readB=~SA.

The recovery process will consist of the step of:

Recovery readB logic: DL1=~SA AND DL.

This equation showed that the program data remained in DL1 will be combined with the read data at B state in the Sense Amplifier (SA). The logic is the reverse data from SA (~readB results ) will be logic AND together with the remaining data in DL1. The logically combined data will be stored back to DL1.

Figure 25:
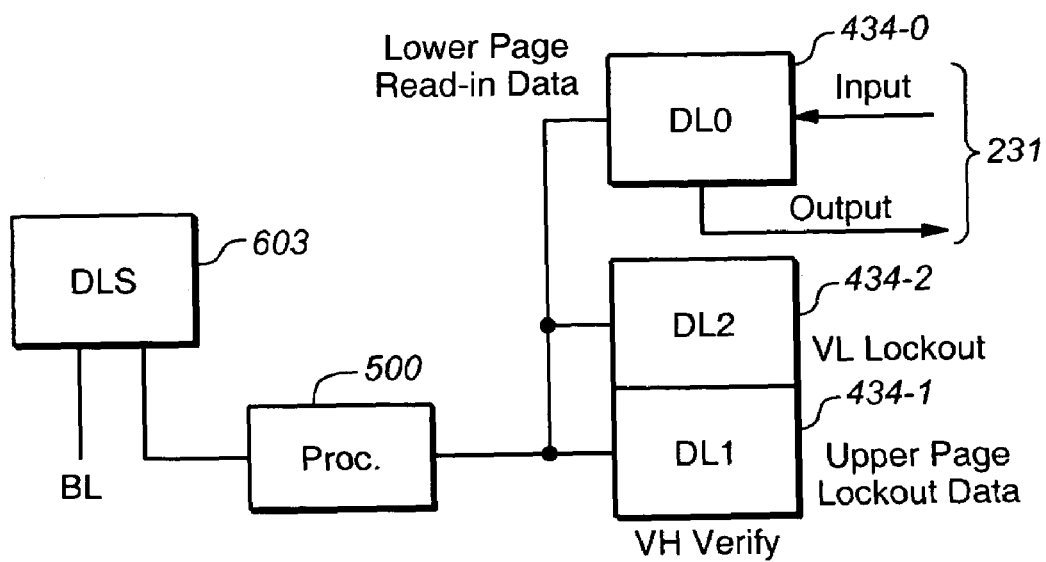
FIG. 25 describes the use of the data latches of FIG. 10 to implement quick pass write for an upper data page in alternate two page codings.

As shown in FIG. 31, this will correct both B and C error, as both need to be considered as a failed write may leave a cell anywhere between the E and C distributions. The top line of FIG. 31 shows that target data state and the,new line the lower page data that was read into DL0 434-0. Line (1C) indicates that the "01" state did not finish program successfully and that "0" remained in DL1. The rest of the states have completed the program, so that "1" is remained in the DL1. After sensing the word line at B level (2C), the result will be stored in the sense amp SA. A logic inversion can be done through the processor 500, as shown in FIG. 25. Line (3C) is the result after the logic AND operation combining SA result with the previous DL1. Line (3C) showed the correct upper page coding for all 4 states.

In both cases shown in FIG. 31, the last line (2C, 3C) results in the correct upper page data ("1" for the E and A states, "0" for the B and C states). Line (1B) to (3B) show the case for recovering the B bits under program failure. The code in line (1B) is the remaining data when B state did not complete the program. There is "0" in B state ("00" state). Following exactly same procedure as for the "01" state recovery logic, the B sensing result was combined with the remaining data in the DL1 with logic AND operation. The final result is stored back in DL1. Line (3B) is the correct coding for upper page for all 4 states. This illustrated the recovery logic can be applied on both B and C underprogram failures. In memory data recovery operations, the state machine does not normally know the failure mode. Therefore, it is only feasible if one logic equation is needed to recovery all possible under program failures.

The following invention can also be implemented when two (or more) bits are programmed concurrently. Even in the upper page/lower page arrangement, 2-bit programming can occur as part of a lower page to full sequence conversion, such as is described in U.S. patent application Ser. No. 11/013,125 ("Overlapped Programming of Upper and Lower MLC Pages" section), or when, after a program fail, both the upper and lower page are written concurrently to the new location. The 2-bit recovery logic can also be used in systems arranged with the 2 bits are located on the same page.

In full sequence programming, a write error can occur on both lower page and upper page data. The latch assignment of the exemplary embodiment is as shown in FIG. 32 and conventional code is again used. Both lower and upper page data needs to be recovered and, since a failed write could end up anywhere between the E and C distributions. As long as the data is encoded with the conventional code, the full sequence case can be recovered with the same read logic as for the single page case. A number of combinations need to be checked, as shown in FIG. 33. As before the "Cell data" heading refers to the E, A, B, and C target states in the "upper page, lower page" format.

In conventional code, a normal read of lower page data is (readA OR ~readC); that is; the readA result is logically OR-ed with the reverse of the readC result, where both readA and readC (and readB) are the reverse data from the sense amp (~SA). The normal upper page read is just readB.

In case of a write error, the following set of step can be used to recover the data. The following assume that lower page data is in DL1 434-1 and upper page data is in DL0 434-0. Upper page recovery read is again:
  (i) readB;
  (ii) readB & DL0→DL0;

This combines the read B result with DL0 434-0 remnant data and saves the result in DL0 434-0. The lower page recovery will need both the readA and readC recovery:
  (i) readA;
  (ii) readA AND DL1→DL1;

This step combines the readA result with the DL1 434-1 remaining data (AND logic) and saves the result in DL1 434-1.
  (iii) readC;
  (iv) ~readC|DL1|(~DL0 & DL1)→DL1.

This step combines reverse readC result with the DL1 434-1 previous data (OR logic) and also checks if the bits are 01 and saved the result in DL1 434-1. Here the readC data and the DL1 434-1 data is not sufficient to recover the original data. The failed C state must be confirmed by checking both DL1 434-1 and DL0 434-0 using AND logic (~DL0 & DL1). (This is shown as step 5' in FIG. 33, which is only explicitly shown there in some cases.)

At the end of this process, the lower page data will have been saved in DL1 434-1 (step 6) and the upper page data will have been saved in DL0 434-0 (step 4).

FIG. 33 shows the results of these steps for the various cases. In each case, line 4 shows the recovered upper page data and line 6 the recovered lower page data. A logical OR is represented as | in the tables (e.g., readA|~readC is readA OR ~readC). Where the table indicates "0/1", this indicates that either result may be returned depending on whether the cell lies. The step 5' is shown only in the C error cases. As the state machine normally cannot know what type of error has occurred, the extra logic operation done in the case of C error is also applied to the cases with other errors, although it is not necessary there. Therefore all the logic operations are applied to all the cases listed here. Step (5') is not explicitly shown in many cases for simplicity, since the extra logic operation will not produce different results from the data listed in the table.

In FIG. 33 the various cases are shown in the order corresponding to three programmed states of the example: an A-state error, followed by a B-state error, followed by a C-error for when the readA process passed and then when it failed. In the order of the steps in FIG. 33 it should be noted that various read processes are done in the order of the states (A, B, C), and that, consequently, the upper page recovery steps fall in the middle of the lower page recovery steps; that is, steps (1), (2), (5), and (6) respectively correspond to steps (i)-(iv) of the lower page recover described above, with (3) and (4) corresponding to (i) and (ii) of the upper page recovery.

Assuming the case of an A state error, the upper page data in DL0 will be all 1s, with lower page data remaining in DL1 having an erroneous 0 in the A ("10") slot. In step (1), the readA result will yield a 1 for the "10" state, which, when combined by the logic with the DL1 contents, leads to line (2). The lower page data recovery continues at step (5) with readC, which is then combined according to the logic with the result of step (2) to recover the lower page data at line (6). The upper page data is given in line (4), where step (3) is omitted as the error is assumed to be for the A state here.

The case assuming a B error results in an incorrect 0 in the "00" slot for both DL0 and DL1. In step (1), readA can yield either 1 or 0 depending on where the cell ended up: in either case, the logic gives a 0 for the "00" column is line (2). readB follows in step (3), yielding a 1 for the "00", giving the recovered upper page data in step (4) when combined according to the logic with DL0. Returning to the lower page recovery in step (5), the result of readC is taken and combined in step (6) to give the correct lower page data.

Assuming a C state error, the upper page data in DL0 will have an erroneous 0 in the "01" column. Assuming the readA operation passes, steps (1) and (2) will correctly have (1,0,0, 0) for the four states. In step (3), however, depending on how far the cell made it, it may end up either below or above the readB level and can give either 1 or 0 for the "01" column. In either case, the logic will correct this and the upper page data is recovered in line (4). Returning to the lower page recovery, as the error is assumed to be in the C state, step (5) gives 0 for all columns. Consequently, as noted above, in this case the readC data and the DL1 434-1 data is not sufficient to recover the original data and step (5') is used to rectify this. The failed C state is then confirmed by checking both DL1 434-1 and DL0 434-0 using AND logic (~DL0 & DL1), which is combined with line (2) to give the restored lower page data in step (6).

Assuming a C state error and that the A state also failed (that is, the C error is such that the cells was only programmed below A state read level), each of steps (1)-(3) give an erroneous 1 for the "01" column. For the upper page data, the correct data is recovered in step (4) as for the preceding C fail, A pass case. In step (5), readC again gives 0 for all states and needs to be rectified by step (5'), giving 1 in the "01" column, which the logic then migrates to line, (6) and the restored lower page data.

As the memory will be aware of which programming mode it is operating in (upper page, lower page, or full sequence), can select the proper recovery mode when program fail is returned. In each of the cases, the recovery process involves combining the (failed) verify data remaining in the latches with the results of one or more reads. Based on these combinations, the correct data can then be recovered on the memory using only the data latches and the state machine without having to maintain a copy of the data in a buffer on the controller (or on the memory once it is loaded into the latches).

The procedures for the "LM" codes are now described, beginning with "LM old" code shown in FIG. 23. In the LM codes, the page order is often that shown in FIG. 26B, where the upper page may be programmed much later than the lower page on the same word line. Consequently, the lower page data has to be read in at the beginning of the upper page program. The upper page program in LM code will be similar with the 2 bits program case in conventional code.

In the LM old code, the code is similar to the conventional code but with the lower and upper pages exchanged:
    upper page (LM old code)=lower page (conventional);
    lower page (LM old code)=upper page (conventional).

The upper page normal read is consequently readA |~readC; that is to say the readA result and reverse readC result will be logically OR-ed together to form the lower page data. The lower page normal read is then readB. Since the codes have such similarity, the recovery method is also the same with conventional.

The following assumes the latch assignment that the LM lower page data is in DL0 434-0 and the upper page is in DL1 434-1. Upper page recovery read:
  1) readA;
  2) readA AND DL1→DL1;

This step combines the readA result with the DL1 434-1 remaining data (AND logic) and saves the result in DL1 434-1.
  3) readC;
  4) readC|DL1|(~DL0 & DL1)→DL1;

Combine (OR logic) reverse readC result with the previous data in DL1 434-1 and also check if the bits are 01 and save the result in DL1 434-1. Here the readC data and the DL1 data are not sufficient to recover the original data. The failed C state must be confirmed by checking both DL1 434-1 and DL0 434-0 using AND logic (~DL0 434-0 & DL1 434-1).
  Lower page recovery read:
  1) readB;
  2) readB & DL0→DL0; Combine read B result with DL0 434-0 remain data and saved the result in DL0 434-0.

This step combines read B result with the remaining DL0 434-0 data and saves the result in DL0 434-0.
  3) If the upper page in this word line is NOT programmed, the LM flag (indicating whether or not the upper page is programmed in LM code) will be checked and readA will be performed.
  4) readA & DL0→DL0.

This step combines readA result with the remaining DL0 434-0 data and saves the result in DL0 434-0.

The "LM new" code is shown in FIG. 24. In this code, the normal upper page read is given by (readA OR~readB ) AND readC; that is, the readA data will be combined with reverse readB data using OR logic first, with the combined result further combined with the readC result using AND logic. The normal lower page read is just readB, as it is with LM old code lower page, although the LM flag needs to be checked: in this code, if the upper page has not been programmed and only a lower page has been written to the word line, readA is used instead.

The procedure again assumes the latch assignment that the LM lower page data is in DL0 434-0 and the upper page is in DL1 434-1. The recovered data for the lower page is the same as for the LM old code and is again obtained by:

readB AND DL1, where DL1 refers to the remaining DL1 434-1. The recovery read for upper page corresponds to:

((readA AND DL0) OR~readB OR (~DL0 AND DL1)) AND readC AND (DL0 OR DL1).

This last equation contains the orders of operations when the data latches are used repeated used; or example, the (~DL0 AND DL1) operation should be done before the (readA AND DL0) operation if the later operation result is stored back at DL0. In other embodiments, the operation (~DL0 AND DL1) result could be stored in another data latch (such as DL2) temporarily, from where it could be combined with other logic operations when needed. The table of FIG. 34 shows various stages of the process for recovering the upper page in the different cases in the LM new code.

In FIG. 34, some of the steps are not shown, particularly if these steps yield trivial results; for example, DL0 OR DL1 is trivially 1 for both an A error (as DL1 is 1 for all cases) and a B error (as DL0 is 1 for all cases). In each case, the recovery read for the upper page is saved in DL1 and the lower page data (read in at the beginning of the program algorithm) is stored in DL0. Beginning with the case of an A error, the error is-reflected in the "01" column of the data remaining in DL0. In step (1), readA then gives 1 in the "01" column, which is then corrected by ANDing with DL0 in step (2). Step (4) then combines ~readB (from step (3)) with the result of step (2), which is then further combined in step (6) with readC (step (5)) to obtain the corrected upper page data. In this case, the expressions (~DL0 AND DL1)) and (DL0 OR DL1) are not explicitly computed as they drop out of the expression.

For the case of a B error, DL0 is now 0 for the "10" column, with DL1 again 1 for all cases. Consequently, (DL0 OR DL1) is again 1 for all cases and omitted from the steps. (~DL0 AND DL1) can be done ahead of line (1) and stored in another data latch, such as DL2. The result of (~DL0 AND DL1) will be "0 0 1 0" where only "10" column has a "1". In step (1), readA can give either 1 or 0, which when combined with DL0 gives (1,0,0,0) in step (2). Line (3) gives ~readB, which may or may not give 0 depending on how far the cell programmed. All the above results can be combined in line (4) in OR logic and stored back in DL0. In step (5) readC give (1,1,1,0) as, regardless when the state ended up, as it failed to verify for B, it will be below readC. Finally, ANDing readC with line (4) (in DL0) gives the recovered upper page data in line (6).

Assuming a C state failure, this will give a 0 in both DL0 and DL1. An initial step (DL0 OR DL1) (line 0) is executed before line (1) if the line (1) operation result is stored in DL0. The logic operation (DL0 OR DL1) should be stored in another data latch such as DL2. The result of readA (which is here the same as readA AND DL0) is in line (1), followed by~readB in line (2). Lines (1) and (2) are then ORed in step (3). (As DL0=DL1 here, (~DL0 AND DL1)=0 and is omitted.) As readC is 1 in all cases (line 4), when ANDed with line (3) it gives the same values back in line (5). As DL0=DL1= (1,1,1,0), (DL0 OR DL)=(1,1,1,0) in line (6). ANDing lines (5) and (0) then gives the recovered upper page in line (6). The correct upper page data is again "1 0 1 0".

As already noted, FIG. 34 only shows the upper page recovery process for the LM new code. As shown in FIGS. 23 and 24, the LM old and LM new codes both have the same encoding of the lower pages data and for the LM new code, the lower page data can again be recovered by (readB AND DL1) as described for the LM old code.

Thus, for all of the codes, the data recovery can be done in the following simple rules regardless which code being used. In each case, the remaining verify data is combined with the results of one or more read operations in logical operations to extract the intended target data by using non-overwrite logic combining the remaining data in data latches and sensing results.

As shown in FIGS. 23 and 24, both LM codes initially program the lower page to the broad X distribution as described in U.S. patent application Ser. No. 11/083,514, which is incorporated herein by reference. In both cases, as both codes separate the two bits on the same physical cell into two separate logical pages, an upper page program failure will destroy the lower page data that was previously program. Since the lower page may have be programmed quite some time previously, the data recovery becomes very important since this data is no longer held by the controller memory. Even if the lower page was relatively recently programmed, maintaining the lower page in the controller would require large amounts of buffering, which is not preferred.

In the conventional code, lockout for the upper page write will only occur on the data latch where upper page program data was stored; therefore, the lower page data is intact during the upper page program lockout process. In the LM codings, however, the lower page is a rough program to intermediate X state, with the upper page write equivalent to 2-bit programming as all of the A/B/C states needing to be programmed. In this case, the two data latches DL0 and DL1 are used for storing the 2-bit programming data that will get locked out, with "0" being changed to "1". In this case the lower page information could be permanently lost. To avoid this, the following schemes can be used to keep a good copy of lower page data for the user.

Figure 35:
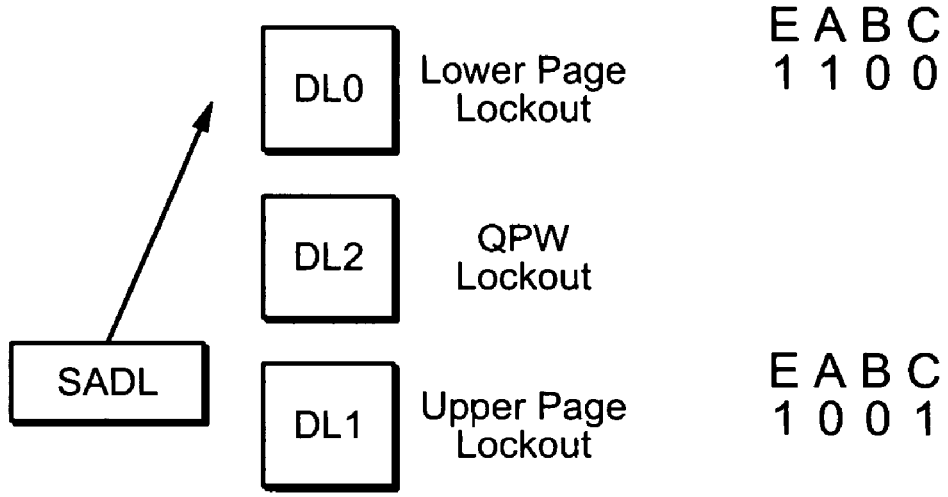
FIGS. 35 and 36 show data latch assignments for two embodiments to recovery lower page data in codes of FIGS. 23 and 24.

In a first embodiment, the data latches are assigned in the following diagram as in FIG. 35. Here, DL0 434-0 is the lower bit data read in from the array: In the LM codes, the lower bit for erase and A, B, C states will respectively be 1, 1, 0, 0. DL1 434-1 will hold the upper page program data, which was input from user for the current program. The LM old code for the upper bit for erase and A, B, C states will respectively be 1, 0, 0, 1.

Since the A state has a lower threshold voltage than B and C states, program verify A is needed at the beginning of the program algorithm, with the B program verify starting after some number of program pulses, as described in more detail U.S. patent application Ser. No. 11/013,125. When the cells with A data finished program, the lockout is registered in DL1 434-1, where "0" is flipped to "1". DL0 434-0.will not change. When the B states start to verify, the DL0 data will also be changed for lockout. The data in DL0 will thus be intact during the time period of A verify before B states begin to verify. In a typical system, this time is normally in the order of 150 μs, which is enough time for the user to extract and toggle out the lower bit data to copy it to another location, such as buffering it on the memory or the controller or to latches for another physical page. The LM new code case will be similar to the LM old code in recovering the lower bit program data during upper page program failure as the lower page is encoded the same for both codes.

Another embodiment that can be used obtain a good copy of the lower page data in the LM codes uses the extra latch, DL2 434-2, for lockout, allowing for the original data to be kept until the end of the write. Unlike the other embodiments in this section, as DL0, DL1, and DL2 are all used here, the sort of cache programming described in U.S. patent application Ser. No. 11/097,590 may not be allowed in this case. The data latch assignment here is shown in FIG. 36.

Figure 36:
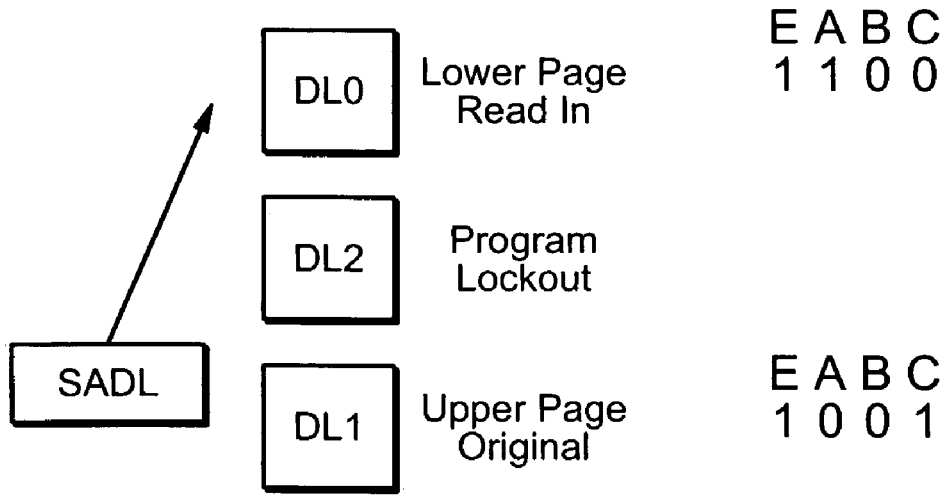

As shown in FIG. 36, DL2 is used for the program lockout, rather than for the Quick Pass Write lockout. Consequently, if the Quick Pass Write algorithm is also used, an additional latch DL3 will be added for QPW lockout (VL lockout). In any of these variations, the use of DL2 in this way allows the lower page data to remain intact throughout the whole program algorithm.

It should also be noted that these methods of lower page recovery in the LM codes do not assume that the program failure is due to slow bits. They also do not, as is one of the of the data recovery methods in the preceding discussion, require that the read is still executable. These last techniques do, however, assume that upper page data will be kept in controller or otherwise buffered. This recovery method for lower page can be more useful in many cases since it does not assume any particular failure mode, nor does it assume that the memory cells are still readable.

For all of the forgoing embodiments, it should be noted that these have been primarily described for the 2-bit per cell case. The techniques readily extent to systems storing 3-, 4-, or more bits per cell for both multi-page format and for full sequence operation. For example, the 3- and 4-bit cases would respectively require an extra one and two data latches for a given embodiment relative to the 2-bit case.

Although the various aspects of the present invention have been described with respect to certain embodiments, it is understood that the invention is entitled to protection within the full scope of the appended claims.

What is claimed is:

1. A non-volatile memory, comprising:
a memory array having a plurality of non-volatile memory cells;
program circuitry selectively connectable to the memory cells for writing respective target data states thereto;
a set of data latches, one or more of which are connectable to each of the memory cells being written in a program operation to maintain verify data indicating whether the corresponding memory cell has been successfully written to the respective target data state;
sensing circuitry selectively connectable to the memory cells; and
logic circuitry that in response to an indication of a failed write operation for one or more memory cells combines the results of one or more read results from the sensing circuitry on said one or more memory cells with the corresponding verify data maintained in said memory latches to recover the respective target data state to which said memory cells were to have been programmed.

2. The memory of claim 1, wherein said non-volatile memory is part of a memory system including a controller and said non-volatile memory and said target data states are not maintained in said controller subsequent to performing a program operation write said target data to said memory cells.

3. The memory of claim 2, wherein said target data states are not maintained in the memory independently of said verify data.

4. The memory of claim 1, wherein said memory cells are multi-state memory cells.

5. The memory of claim 4, wherein said memory stores multi-state data in the memory cells in an upper page, lower page format and said target data is upper page target data.

6. The memory of claim 5, wherein said memory writes lower page data said memory cells prior to writing upper page target data to said memory cells.

7. The memory of claim 6, wherein sense circuitry reads lower page data into said data latches prior to writing the upper page target data to said memory cells.

8. The memory of claim 5, wherein said logic circuitry recovers both the lower page data and upper page target data.

* * * * *